(12) United States Patent
Yun et al.

(10) Patent No.: US 7,814,390 B2
(45) Date of Patent: Oct. 12, 2010

(54) RATE MATCHING METHOD IN MOBILE COMMUNICATION SYSTEM

(75) Inventors: Young Woo Yun, Seoul (KR); Ki Jun Kim, Seoul (KR); Sung Lark Kwon, Seoul (KR); Young Jo Lee, Seoul (KR); Sung Kwon Hong, Kyonggi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 12/399,882

(22) Filed: Mar. 6, 2009

(65) Prior Publication Data

US 2009/0175298 A1 Jul. 9, 2009

Related U.S. Application Data

(63) Continuation of application No. 11/404,175, filed on Apr. 13, 2006, now Pat. No. 7,523,383, which is a continuation of application No. 10/622,781, filed on Jul. 21, 2003, now Pat. No. 7,089,480, which is a continuation of application No. 09/615,603, filed on Jul. 13, 2000, now Pat. No. 6,622,281.

(30) Foreign Application Priority Data

| Jul. 14, 1999 | (KR) | 1999/28358 |
| Aug. 23, 1999 | (KR) | 1999/35023 |
| Oct. 7, 1999 | (KR) | 1999/43254 |
| Nov. 1, 1999 | (KR) | 1999/48001 |

(51) Int. Cl.
*H03M 13/00* (2006.01)
(52) U.S. Cl. .................... 714/755; 714/790
(58) Field of Classification Search ........... 714/701, 714/755, 790
See application file for complete search history.

(56) References Cited

U.S. PATENT DOCUMENTS 5,483,541 A * 1/1996 Linsky ................ 714/701

(Continued)

OTHER PUBLICATIONS

"Alternative Uplink Puncturing Algorithm," 3GPP TSG-RAN Working Group 1(Radio) meeting #6, Espoo, Finland, Jul. 13-16, 1999, published Jul. 9, 1999.

(Continued)

*Primary Examiner*—Esaw T Abraham
(74) *Attorney, Agent, or Firm*—Lee, Hong, Degerman, Kang & Waimey

(57) ABSTRACT

A rate matching method is provided for a mobile communication system that performs an adjustment to a code rate based on an optimal level by puncturing or repetition to respective bit streams of transport channels. The rate matching method is preferably applicable to uplink and downlink rate matching for channel coding including turbo coding, convolutional coding and the like. The rate matching method for uplink can include executing coding for bits of a transport channel, and branching off the bits into a plurality of sequences, constructing a first interleaving pattern for the plurality of sequences, constructing a virtual interleaving pattern for at least one sequence based on a mapping rule with a corresponding first interleaving pattern and calculating different bit shifting values in each column of each virtual interleaving pattern. Then, a bit position to be punctured is determined in each constructed virtual interleaving pattern using the calculated bit shifting values.

13 Claims, 19 Drawing Sheets

U.S. PATENT DOCUMENTS

| | | |
|---|---|---|
| 5,970,085 A | 10/1999 | Yi |
| 5,978,365 A | 11/1999 | Yi |
| 6,023,783 A | 2/2000 | Divsalar et al. |
| 6,088,387 A | 7/2000 | Gelblum et al. |
| 6,397,367 B1 * | 5/2002 | Park et al. .................. 714/786 |
| 6,453,442 B1 * | 9/2002 | Sadjadpour et al. ......... 714/787 |
| 6,622,281 B1 * | 9/2003 | Yun et al. .................. 714/790 |
| 6,631,491 B1 * | 10/2003 | Shibutani et al. ............ 714/762 |
| 6,671,851 B1 * | 12/2003 | Moulsley .................... 714/790 |
| 6,993,062 B1 * | 1/2006 | Kong et al. ................. 375/130 |
| 7,089,480 B2 | 8/2006 | Yun et al. |

OTHER PUBLICATIONS

"Code Symbol Based Uplink Puncturing Algorithm," 3GPP TSG-RAN Working Group 1(Radio) meeting #6, Espoo, Finland, Jul. 13-16, 1999, published Jul. 9, 1999.

Frenger et al, "Rate Matching in Multichannel Systems using RCPC-Codes," IEEE 47th Vehicular Technology Conference, Phoenix, AZ (US), published May 4-7, 1997, vol. 1, pp. 354-357.

"Properties of Optimised Puncturing Scheme," 3GPP TSG-RAN Working Group 1 meeting #5, Cheju, Korea, Jun. 1-4, 1999.

* cited by examiner

FIG. 3
Prior Art

| 0 | 4 | 2 | 6 | 1 | 5 | 3 | 7 |
|---|---|---|---|---|---|---|---|
| 0 | 1 | 2 | 3 | 4 | 5 | 6 | 7 |
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |
| 64 | 65 | 66 | 67 | 68 | 69 | 70 | 71 |
| 72 | 73 | 74 | 75 | 76 | 77 | 78 | 79 |
| 80 | 81 | 82 | 83 | 84 | 85 | 86 | 87 |
| 88 | 89 | 90 | 91 | 92 | 93 | 94 | 95 |

FIG.6

| | | | | | | | |
|---|---|---|---|---|---|---|---|
| $x_0$ | $y_0$ | $z_0$ | $x_1$ | $y_1$ | $z_1$ | $x_2$ | $y_2$ |
| $z_2$ | $x_3$ | $y_3$ | $z_3$ | $x_4$ | $y_4$ | $z_4$ | $x_5$ |
| $y_5$ | $z_5$ | $x_6$ | $y_6$ | $z_6$ | $x_7$ | $y_7$ | $z_7$ |
| $x_8$ | $y_8$ | $z_8$ | $x_9$ | $y_9$ | $z_9$ | $x_{10}$ | $y_{10}$ |
| $z_{10}$ | $x_{11}$ | $y_{11}$ | $z_{11}$ | $x_{12}$ | $y_{12}$ | $z_{12}$ | $x_{13}$ |
| $y_{13}$ | $z_{13}$ | $x_{14}$ | $y_{14}$ | $z_{14}$ | $x_{15}$ | $y_{15}$ | $z_{15}$ |
| $x_{16}$ | $y_{16}$ | $z_{16}$ | $x_{17}$ | $y_{17}$ | $z_{17}$ | $x_{18}$ | $y_{18}$ |
| $z_{18}$ | $x_{19}$ | $y_{19}$ | $z_{19}$ | $x_{20}$ | $y_{20}$ | $z_{20}$ | $x_{21}$ |
| $y_{21}$ | $z_{21}$ | $x_{22}$ | $y_{22}$ | $z_{22}$ | $x_{23}$ | $y_{23}$ | $z_{23}$ |
| $x_{24}$ | $y_{24}$ | $z_{24}$ | $x_{25}$ | $y_{25}$ | $z_{25}$ | $x_{26}$ | $y_{26}$ |
| $z_{26}$ | $x_{27}$ | $y_{27}$ | $z_{27}$ | $x_{28}$ | $y_{28}$ | $z_{28}$ | $x_{29}$ |
| $y_{29}$ | $z_{29}$ | $x_{30}$ | $y_{30}$ | $z_{30}$ | $x_{31}$ | $y_{31}$ | $z_{31}$ |
| $x_{32}$ | $y_{32}$ | $z_{32}$ | $x_{33}$ | $y_{33}$ | $z_{33}$ | $x_{34}$ | $y_{34}$ |
| $z_{34}$ | $x_{35}$ | $y_{35}$ | $z_{35}$ | $x_{36}$ | $y_{36}$ | $z_{36}$ | $x_{37}$ |
| $y_{37}$ | $z_{37}$ | $x_{38}$ | $y_{38}$ | $z_{38}$ | $x_{39}$ | $y_{39}$ | $z_{39}$ |
| $x_{40}$ | $y_{40}$ | $z_{40}$ | $x_{41}$ | $y_{41}$ | $z_{41}$ | $x_{42}$ | $y_{42}$ |
| $z_{42}$ | $x_{43}$ | $y_{43}$ | $z_{43}$ | $x_{44}$ | $y_{44}$ | $z_{44}$ | $x_{45}$ |
| $y_{45}$ | $z_{45}$ | $x_{46}$ | $y_{46}$ | $z_{46}$ | $x_{47}$ | $y_{47}$ | $z_{47}$ |
| $x_{48}$ | $y_{48}$ | $z_{48}$ | $x_{49}$ | $y_{49}$ | $z_{49}$ | $x_{50}$ | $y_{50}$ |
| $z_{50}$ | $x_{51}$ | $y_{51}$ | $z_{51}$ | $x_{52}$ | $y_{52}$ | $z_{52}$ | $x_{53}$ |
| $y_{53}$ | $z_{53}$ | $x_{54}$ | $y_{54}$ | $z_{54}$ | $x_{55}$ | $y_{55}$ | $z_{55}$ |
| $x_{56}$ | $y_{56}$ | $z_{56}$ | $x_{57}$ | $y_{57}$ | $z_{57}$ | $x_{58}$ | $y_{58}$ |
| $z_{58}$ | $x_{59}$ | $y_{59}$ | $z_{59}$ | $x_{60}$ | $y_{60}$ | $z_{60}$ | $x_{61}$ |
| $y_{61}$ | $z_{61}$ | $x_{62}$ | $y_{62}$ | $z_{62}$ | $x_{63}$ | $y_{63}$ | $z_{63}$ |
| $x_{64}$ | $y_{64}$ | $z_{64}$ | $x_{65}$ | $y_{65}$ | $z_{65}$ | $x_{66}$ | $y_{66}$ |
| $z_{66}$ | $x_{67}$ | $y_{67}$ | $z_{67}$ | $x_{68}$ | $y_{68}$ | $z_{68}$ | $x_{69}$ |
| $y_{69}$ | $z_{69}$ | $x_{70}$ | $y_{70}$ | $z_{70}$ | $x_{71}$ | $y_{71}$ | $z_{71}$ |
| $x_{72}$ | $y_{72}$ | $z_{72}$ | $x_{73}$ | $y_{73}$ | $z_{73}$ | $x_{74}$ | $y_{74}$ |
| $z_{74}$ | $x_{75}$ | $y_{75}$ | $z_{75}$ | $x_{76}$ | $y_{76}$ | $z_{76}$ | $x_{77}$ |
| $y_{77}$ | $z_{77}$ | $x_{78}$ | $y_{78}$ | $z_{78}$ | $x_{79}$ | $y_{79}$ | $z_{79}$ |
| $x_{80}$ | $y_{80}$ | $z_{80}$ | $x_{81}$ | $y_{81}$ | $z_{81}$ | $x_{82}$ | $y_{82}$ |
| $z_{82}$ | $x_{83}$ | $y_{83}$ | $z_{83}$ | $x_{84}$ | $y_{84}$ | $z_{84}$ | $x_{85}$ |
| $y_{85}$ | $z_{85}$ | $x_{86}$ | $y_{86}$ | $z_{86}$ | $x_{87}$ | $y_{87}$ | $z_{87}$ |
| $x_{88}$ | $y_{88}$ | $z_{88}$ | $x_{89}$ | $y_{89}$ | $z_{89}$ | $x_{90}$ | $y_{90}$ |
| $z_{90}$ | $x_{91}$ | $y_{91}$ | $z_{91}$ | $x_{92}$ | $y_{92}$ | $z_{92}$ | $x_{93}$ |
| $y_{93}$ | $z_{93}$ | $x_{94}$ | $y_{94}$ | $z_{94}$ | $x_{95}$ | $y_{95}$ | $z_{95}$ |

FIG.7a

| 1 | 4 | 7 | 2 | 5 | 0 | 3 | 6 |
|---|---|---|---|---|---|---|---|
| $y_0$ | $y_1$ | $y_2$ | $y_3$ | $y_4$ | $y_5$ | $y_6$ | $y_7$ |
| $y_8$ | $y_9$ | $y_{10}$ | $y_{11}$ | $y_{12}$ | $y_{13}$ | $y_{14}$ | $y_{15}$ |
| $y_{16}$ | $y_{17}$ | $y_{18}$ | $y_{19}$ | $y_{20}$ | $y_{21}$ | $y_{22}$ | $y_{23}$ |
| $y_{24}$ | $y_{25}$ | $y_{26}$ | $y_{27}$ | $y_{28}$ | $y_{29}$ | $y_{30}$ | $y_{31}$ |
| $y_{32}$ | $y_{33}$ | $y_{34}$ | $y_{35}$ | $y_{36}$ | $y_{37}$ | $y_{38}$ | $y_{39}$ |
| $y_{40}$ | $y_{41}$ | $y_{42}$ | $y_{43}$ | $y_{44}$ | $y_{45}$ | $y_{46}$ | $y_{47}$ |
| $y_{48}$ | $y_{49}$ | $y_{50}$ | $y_{51}$ | $y_{52}$ | $y_{53}$ | $y_{54}$ | $y_{55}$ |
| $y_{56}$ | $y_{57}$ | $y_{58}$ | $y_{59}$ | $y_{60}$ | $y_{61}$ | $y_{62}$ | $y_{63}$ |
| $y_{64}$ | $y_{65}$ | $y_{66}$ | $y_{67}$ | $y_{68}$ | $y_{69}$ | $y_{70}$ | $y_{71}$ |
| $y_{72}$ | $y_{73}$ | $y_{74}$ | $y_{75}$ | $y_{76}$ | $y_{77}$ | $y_{78}$ | $y_{79}$ |
| $y_{80}$ | $y_{81}$ | $y_{82}$ | $y_{83}$ | $y_{84}$ | $y_{85}$ | $y_{86}$ | $y_{87}$ |
| $y_{88}$ | $y_{89}$ | $y_{90}$ | $y_{91}$ | $y_{92}$ | $y_{93}$ | $y_{94}$ | $y_{95}$ |

FIG.7b

| 2 | 5 | 0 | 3 | 6 | 1 | 4 | 7 |
|---|---|---|---|---|---|---|---|
| $z_0$ | $z_1$ | $z_2$ | $z_3$ | $z_4$ | $z_5$ | $z_6$ | $z_7$ |
| $z_8$ | $z_9$ | $z_{10}$ | $z_{11}$ | $z_{12}$ | $z_{13}$ | $z_{14}$ | $z_{15}$ |
| $z_{16}$ | $z_{17}$ | $z_{18}$ | $z_{19}$ | $z_{20}$ | $z_{21}$ | $z_{22}$ | $z_{23}$ |
| $z_{24}$ | $z_{25}$ | $z_{26}$ | $z_{27}$ | $z_{28}$ | $z_{29}$ | $z_{30}$ | $z_{31}$ |
| $z_{32}$ | $z_{33}$ | $z_{34}$ | $z_{35}$ | $z_{36}$ | $z_{37}$ | $z_{38}$ | $z_{39}$ |
| $z_{40}$ | $z_{41}$ | $z_{42}$ | $z_{43}$ | $z_{44}$ | $z_{45}$ | $z_{46}$ | $z_{47}$ |
| $z_{48}$ | $z_{49}$ | $z_{50}$ | $z_{51}$ | $z_{52}$ | $z_{53}$ | $z_{54}$ | $z_{55}$ |
| $z_{56}$ | $z_{57}$ | $z_{58}$ | $z_{59}$ | $z_{60}$ | $z_{61}$ | $z_{62}$ | $z_{63}$ |
| $z_{64}$ | $z_{65}$ | $z_{66}$ | $z_{67}$ | $z_{68}$ | $z_{69}$ | $z_{70}$ | $z_{71}$ |
| $z_{72}$ | $z_{73}$ | $z_{74}$ | $z_{75}$ | $z_{76}$ | $z_{77}$ | $z_{78}$ | $z_{79}$ |
| $z_{80}$ | $z_{81}$ | $z_{82}$ | $z_{83}$ | $z_{84}$ | $z_{85}$ | $z_{86}$ | $z_{87}$ |
| $z_{88}$ | $z_{89}$ | $z_{90}$ | $z_{91}$ | $z_{92}$ | $z_{93}$ | $z_{94}$ | $z_{95}$ |

FIG.8a

| 1 | 4 | 7 | 2 | 5 | 0 | 3 | 6 |
|---|---|---|---|---|---|---|---|
| $y_0$ | $y_1$ | $y_2$ | $y_3$ | $y_4$ | $y_5$ | $y_6$ | $y_7$ |
| $y_8$ | $y_9$ | $y_{10}$ | $y_{11}$ | $y_{12}$ | $y_{13}$ | $y_{14}$ | $y_{15}$ |
| $y_{16}$ | $y_{17}$ | $y_{18}$ | $y_{19}$ | $y_{20}$ | $y_{21}$ | $y_{22}$ | $y_{23}$ |
| $y_{24}$ | $y_{25}$ | $y_{26}$ | $y_{27}$ | $y_{28}$ | $y_{29}$ | $y_{30}$ | $y_{31}$ |
| $y_{32}$ | $y_{33}$ | $y_{34}$ | $y_{35}$ | $y_{36}$ | $y_{37}$ | $y_{38}$ | $y_{39}$ |
| $y_{40}$ | $y_{41}$ | $y_{42}$ | $y_{43}$ | $y_{44}$ | $y_{45}$ | $y_{46}$ | $y_{47}$ |
| $y_{48}$ | $y_{49}$ | $y_{50}$ | $y_{51}$ | $y_{52}$ | $y_{53}$ | $y_{54}$ | $y_{55}$ |
| $y_{56}$ | $y_{57}$ | $y_{58}$ | $y_{59}$ | $y_{60}$ | $y_{61}$ | $y_{62}$ | $y_{63}$ |
| $y_{64}$ | $y_{65}$ | $y_{66}$ | $y_{67}$ | $y_{68}$ | $y_{69}$ | $y_{70}$ | $y_{71}$ |
| $y_{72}$ | $y_{73}$ | $y_{74}$ | $y_{75}$ | $y_{76}$ | $y_{77}$ | $y_{78}$ | $y_{79}$ |
| $y_{80}$ | $y_{81}$ | $y_{82}$ | $y_{83}$ | $y_{84}$ | $y_{85}$ | $y_{86}$ | $y_{87}$ |
| $y_{88}$ | $y_{89}$ | $y_{90}$ | $y_{91}$ | $y_{92}$ | $y_{93}$ | $y_{94}$ | $y_{95}$ |

FIG.8b

| 2 | 5 | 0 | 3 | 6 | 1 | 4 | 7 |
|---|---|---|---|---|---|---|---|
| $z_0$ | $z_1$ | $z_2$ | $z_3$ | $z_4$ | $z_5$ | $z_6$ | $z_7$ |
| $z_8$ | $z_9$ | $z_{10}$ | $z_{11}$ | $z_{12}$ | $z_{13}$ | $z_{14}$ | $z_{15}$ |
| $z_{16}$ | $z_{17}$ | $z_{18}$ | $z_{19}$ | $z_{20}$ | $z_{21}$ | $z_{22}$ | $z_{23}$ |
| $z_{24}$ | $z_{25}$ | $z_{26}$ | $z_{27}$ | $z_{28}$ | $z_{29}$ | $z_{30}$ | $z_{31}$ |
| $z_{32}$ | $z_{33}$ | $z_{34}$ | $z_{35}$ | $z_{36}$ | $z_{37}$ | $z_{38}$ | $z_{39}$ |
| $z_{40}$ | $z_{41}$ | $z_{42}$ | $z_{43}$ | $z_{44}$ | $z_{45}$ | $z_{46}$ | $z_{47}$ |
| $z_{48}$ | $z_{49}$ | $z_{50}$ | $z_{51}$ | $z_{52}$ | $z_{53}$ | $z_{54}$ | $z_{55}$ |
| $z_{56}$ | $z_{57}$ | $z_{58}$ | $z_{59}$ | $z_{60}$ | $z_{61}$ | $z_{62}$ | $z_{63}$ |
| $z_{64}$ | $z_{65}$ | $z_{66}$ | $z_{67}$ | $z_{68}$ | $z_{69}$ | $z_{70}$ | $z_{71}$ |
| $z_{72}$ | $z_{73}$ | $z_{74}$ | $z_{75}$ | $z_{76}$ | $z_{77}$ | $z_{78}$ | $z_{79}$ |
| $z_{80}$ | $z_{81}$ | $z_{82}$ | $z_{83}$ | $z_{84}$ | $z_{85}$ | $z_{86}$ | $z_{87}$ |
| $z_{88}$ | $z_{89}$ | $z_{90}$ | $z_{91}$ | $z_{92}$ | $z_{93}$ | $z_{94}$ | $z_{95}$ |

FIG.8c

| 1 | 4 | 7 | 2 | 5 | 0 | 3 | 6 |
|---|---|---|---|---|---|---|---|
| $y_0$ | $y_1$ | $y_2$ | $y_3$ | $y_4$ | $y_5$ | $y_6$ | $y_7$ |
| $y_8$ | $y_9$ | $y_{10}$ | $y_{11}$ | $y_{12}$ | $y_{13}$ | $y_{14}$ | $y_{15}$ |
| $y_{16}$ | $y_{17}$ | $y_{18}$ | $y_{19}$ | $y_{20}$ | $y_{21}$ | $y_{22}$ | $y_{23}$ |
| $y_{24}$ | $y_{25}$ | $y_{26}$ | $y_{27}$ | $y_{28}$ | $y_{29}$ | $y_{30}$ | $y_{31}$ |
| $y_{32}$ | $y_{33}$ | $y_{34}$ | $y_{35}$ | $y_{36}$ | $y_{37}$ | $y_{38}$ | $y_{39}$ |
| $y_{40}$ | $y_{41}$ | $y_{42}$ | $y_{43}$ | $y_{44}$ | $y_{45}$ | $y_{46}$ | $y_{47}$ |
| $y_{48}$ | $y_{49}$ | $y_{50}$ | $y_{51}$ | $y_{52}$ | $y_{53}$ | $y_{54}$ | $y_{55}$ |
| $y_{56}$ | $y_{57}$ | $y_{58}$ | $y_{59}$ | $y_{60}$ | $y_{61}$ | $y_{62}$ | $y_{63}$ |
| $y_{64}$ | $y_{65}$ | $y_{66}$ | $y_{67}$ | $y_{68}$ | $y_{69}$ | $y_{70}$ | $y_{71}$ |
| $y_{72}$ | $y_{73}$ | $y_{74}$ | $y_{75}$ | $y_{76}$ | $y_{77}$ | $y_{78}$ | $y_{79}$ |
| $y_{80}$ | $y_{81}$ | $y_{82}$ | $y_{83}$ | $y_{84}$ | $y_{85}$ | $y_{86}$ | $y_{87}$ |
| $y_{88}$ | $y_{89}$ | $y_{90}$ | $y_{91}$ | $y_{92}$ | $y_{93}$ | $y_{94}$ | $y_{95}$ |

FIG.8d

| 2 | 5 | 0 | 3 | 6 | 1 | 4 | 7 |
|---|---|---|---|---|---|---|---|
| $z_0$ | $z_1$ | $z_2$ | $z_3$ | $z_4$ | $z_5$ | $z_6$ | $z_7$ |
| $z_8$ | $z_9$ | $z_{10}$ | $z_{11}$ | $z_{12}$ | $z_{13}$ | $z_{14}$ | $z_{15}$ |
| $z_{16}$ | $z_{17}$ | $z_{18}$ | $z_{19}$ | $z_{20}$ | $z_{21}$ | $z_{22}$ | $z_{23}$ |
| $z_{24}$ | $z_{25}$ | $z_{26}$ | $z_{27}$ | $z_{28}$ | $z_{29}$ | $z_{30}$ | $z_{31}$ |
| $z_{32}$ | $z_{33}$ | $z_{34}$ | $z_{35}$ | $z_{36}$ | $z_{37}$ | $z_{38}$ | $z_{39}$ |
| $z_{40}$ | $z_{41}$ | $z_{42}$ | $z_{43}$ | $z_{44}$ | $z_{45}$ | $z_{46}$ | $z_{47}$ |
| $z_{48}$ | $z_{49}$ | $z_{50}$ | $z_{51}$ | $z_{52}$ | $z_{53}$ | $z_{54}$ | $z_{55}$ |
| $z_{56}$ | $z_{57}$ | $z_{58}$ | $z_{59}$ | $z_{60}$ | $z_{61}$ | $z_{62}$ | $z_{63}$ |
| $z_{64}$ | $z_{65}$ | $z_{66}$ | $z_{67}$ | $z_{68}$ | $z_{69}$ | $z_{70}$ | $z_{71}$ |
| $z_{72}$ | $z_{73}$ | $z_{74}$ | $z_{75}$ | $z_{76}$ | $z_{77}$ | $z_{78}$ | $z_{79}$ |
| $z_{80}$ | $z_{81}$ | $z_{82}$ | $z_{83}$ | $z_{84}$ | $z_{85}$ | $z_{86}$ | $z_{87}$ |
| $z_{88}$ | $z_{89}$ | $z_{90}$ | $z_{91}$ | $z_{92}$ | $z_{93}$ | $z_{94}$ | $z_{95}$ |

FIG. 8e

| 1 | 4 | 7 | 2 | 5 | 0 | 3 | 6 |
|---|---|---|---|---|---|---|---|
| $y_0$ | $y_1$ | $y_2$ | $y_3$ | $y_4$ | $y_5$ | $y_6$ | $y_7$ |
| $y_8$ | $y_9$ | $y_{10}$ | $y_{11}$ | $y_{12}$ | $y_{13}$ | $y_{14}$ | $y_{15}$ |
| $y_{16}$ | $y_{17}$ | $y_{18}$ | $y_{19}$ | $y_{20}$ | $y_{21}$ | $y_{22}$ | $y_{23}$ |
| $y_{24}$ | $y_{25}$ | $y_{26}$ | $y_{27}$ | $y_{28}$ | $y_{29}$ | $y_{30}$ | $y_{31}$ |
| $y_{32}$ | $y_{33}$ | $y_{34}$ | $y_{35}$ | $y_{36}$ | $y_{37}$ | $y_{38}$ | $y_{39}$ |
| $y_{40}$ | $y_{41}$ | $y_{42}$ | $y_{43}$ | $y_{44}$ | $y_{45}$ | $y_{46}$ | $y_{47}$ |
| $y_{48}$ | $y_{49}$ | $y_{50}$ | $y_{51}$ | $y_{52}$ | $y_{53}$ | $y_{54}$ | $y_{55}$ |
| $y_{56}$ | $y_{57}$ | $y_{58}$ | $y_{59}$ | $y_{60}$ | $y_{61}$ | $y_{62}$ | $y_{63}$ |
| $y_{64}$ | $y_{65}$ | $y_{66}$ | $y_{67}$ | $y_{68}$ | $y_{69}$ | $y_{70}$ | $y_{71}$ |
| $y_{72}$ | $y_{73}$ | $y_{74}$ | $y_{75}$ | $y_{76}$ | $y_{77}$ | $y_{78}$ | $y_{79}$ |
| $y_{80}$ | $y_{81}$ | $y_{82}$ | $y_{83}$ | $y_{84}$ | $y_{85}$ | $y_{86}$ | $y_{87}$ |
| $y_{88}$ | $y_{89}$ | $y_{90}$ | $y_{91}$ | $y_{92}$ | $y_{93}$ | $y_{94}$ | $y_{95}$ |

FIG. 8f

| 2 | 5 | 0 | 3 | 6 | 1 | 4 | 7 |
|---|---|---|---|---|---|---|---|
| $z_0$ | $z_1$ | $z_2$ | $z_3$ | $z_4$ | $z_5$ | $z_6$ | $z_7$ |
| $z_8$ | $z_9$ | $z_{10}$ | $z_{11}$ | $z_{12}$ | $z_{13}$ | $z_{14}$ | $z_{15}$ |
| $z_{16}$ | $z_{17}$ | $z_{18}$ | $z_{19}$ | $z_{20}$ | $z_{21}$ | $z_{22}$ | $z_{23}$ |
| $z_{24}$ | $z_{25}$ | $z_{26}$ | $z_{27}$ | $z_{28}$ | $z_{29}$ | $z_{30}$ | $z_{31}$ |
| $z_{32}$ | $z_{33}$ | $z_{34}$ | $z_{35}$ | $z_{36}$ | $z_{37}$ | $z_{38}$ | $z_{39}$ |
| $z_{40}$ | $z_{41}$ | $z_{42}$ | $z_{43}$ | $z_{44}$ | $z_{45}$ | $z_{46}$ | $z_{47}$ |
| $z_{48}$ | $z_{49}$ | $z_{50}$ | $z_{51}$ | $z_{52}$ | $z_{53}$ | $z_{54}$ | $z_{55}$ |
| $z_{56}$ | $z_{57}$ | $z_{58}$ | $z_{59}$ | $z_{60}$ | $z_{61}$ | $z_{62}$ | $z_{63}$ |
| $z_{64}$ | $z_{65}$ | $z_{66}$ | $z_{67}$ | $z_{68}$ | $z_{69}$ | $z_{70}$ | $z_{71}$ |
| $z_{72}$ | $z_{73}$ | $z_{74}$ | $z_{75}$ | $z_{76}$ | $z_{77}$ | $z_{78}$ | $z_{79}$ |
| $z_{80}$ | $z_{81}$ | $z_{82}$ | $z_{83}$ | $z_{84}$ | $z_{85}$ | $z_{86}$ | $z_{87}$ |
| $z_{88}$ | $z_{89}$ | $z_{90}$ | $z_{91}$ | $z_{92}$ | $z_{93}$ | $z_{94}$ | $z_{95}$ |

FIG.9a

| | | | | | | | |
|---|---|---|---|---|---|---|---|
| $x_0$ | $y_0$ | $z_0$ | $x_1$ | $y_1$ | $z_1$ | $x_2$ | $y_2$ |
| $z_2$ | $x_3$ | $y_3$ | $z_3$ | $x_4$ | $y_4$ | $z_4$ | $x_5$ |
| $y_5$ | $z_5$ | $x_6$ | $y_6$ | $z_6$ | $x_7$ | $y_7$ | $z_7$ |
| $x_8$ | $y_8$ | $z_8$ | $x_9$ | $y_9$ | $z_9$ | $x_{10}$ | $y_{10}$ |
| $z_{10}$ | $x_{11}$ | $y_{11}$ | $z_{11}$ | $x_{12}$ | $y_{12}$ | $z_{12}$ | $x_{13}$ |
| $y_{13}$ | $z_{13}$ | $x_{14}$ | $y_{14}$ | $z_{14}$ | $x_{15}$ | $y_{15}$ | $z_{15}$ |
| $x_{16}$ | $y_{16}$ | $z_{16}$ | $x_{17}$ | $y_{17}$ | $z_{17}$ | $x_{18}$ | $y_{18}$ |
| $z_{18}$ | $x_{19}$ | $y_{19}$ | $z_{19}$ | $x_{20}$ | $y_{20}$ | $z_{20}$ | $x_{21}$ |
| $y_{21}$ | $z_{21}$ | $x_{22}$ | $y_{22}$ | $z_{22}$ | $x_{23}$ | $y_{23}$ | $z_{23}$ |
| $x_{24}$ | $y_{24}$ | $z_{24}$ | $x_{25}$ | $y_{25}$ | $z_{25}$ | $x_{26}$ | $y_{26}$ |
| $z_{26}$ | $x_{27}$ | $y_{27}$ | $z_{27}$ | $x_{28}$ | $y_{28}$ | $z_{28}$ | $x_{29}$ |
| $y_{29}$ | $z_{29}$ | $x_{30}$ | $y_{30}$ | $z_{30}$ | $x_{31}$ | $y_{31}$ | $z_{31}$ |
| $x_{32}$ | $y_{32}$ | $z_{32}$ | $x_{33}$ | $y_{33}$ | $z_{33}$ | $x_{34}$ | $y_{34}$ |
| $z_{34}$ | $x_{35}$ | $y_{35}$ | $z_{35}$ | $x_{36}$ | $y_{36}$ | $z_{36}$ | $x_{37}$ |
| $y_{37}$ | $z_{37}$ | $x_{38}$ | $y_{38}$ | $z_{38}$ | $x_{39}$ | $y_{39}$ | $z_{39}$ |
| $x_{40}$ | $y_{40}$ | $z_{40}$ | $x_{41}$ | $y_{41}$ | $z_{41}$ | $x_{42}$ | $y_{42}$ |
| $z_{42}$ | $x_{43}$ | $y_{43}$ | $z_{43}$ | $x_{44}$ | $y_{44}$ | $z_{44}$ | $x_{45}$ |
| $y_{45}$ | $z_{45}$ | $x_{46}$ | $y_{46}$ | $z_{46}$ | $x_{47}$ | $y_{47}$ | $z_{47}$ |
| $x_{48}$ | $y_{48}$ | $z_{48}$ | $x_{49}$ | $y_{49}$ | $z_{49}$ | $x_{50}$ | $y_{50}$ |
| $z_{50}$ | $x_{51}$ | $y_{51}$ | $z_{51}$ | $x_{52}$ | $y_{52}$ | $z_{52}$ | $x_{53}$ |
| $y_{53}$ | $z_{53}$ | $x_{54}$ | $y_{54}$ | $z_{54}$ | $x_{55}$ | $y_{55}$ | $z_{55}$ |
| $x_{56}$ | $y_{56}$ | $z_{56}$ | $x_{57}$ | $y_{57}$ | $z_{57}$ | $x_{58}$ | $y_{58}$ |
| $z_{58}$ | $x_{59}$ | $y_{59}$ | $z_{59}$ | $x_{60}$ | $y_{60}$ | $z_{60}$ | $x_{61}$ |
| $y_{61}$ | $z_{61}$ | $x_{62}$ | $y_{62}$ | $z_{62}$ | $x_{63}$ | $y_{63}$ | $z_{63}$ |
| $x_{64}$ | $y_{64}$ | $z_{64}$ | $x_{65}$ | $y_{65}$ | $z_{65}$ | $x_{66}$ | $y_{66}$ |
| $z_{66}$ | $x_{67}$ | $y_{67}$ | $z_{67}$ | $x_{68}$ | $y_{68}$ | $z_{68}$ | $x_{69}$ |
| $y_{69}$ | $z_{69}$ | $x_{70}$ | $y_{70}$ | $z_{70}$ | $x_{71}$ | $y_{71}$ | $z_{71}$ |
| $x_{72}$ | $y_{72}$ | $z_{72}$ | $x_{73}$ | $y_{73}$ | $z_{73}$ | $x_{74}$ | $y_{74}$ |
| $z_{74}$ | $x_{75}$ | $y_{75}$ | $z_{75}$ | $x_{76}$ | $y_{76}$ | $z_{76}$ | $x_{77}$ |
| $y_{77}$ | $z_{77}$ | $x_{78}$ | $y_{78}$ | $z_{78}$ | $x_{79}$ | $y_{79}$ | $z_{79}$ |
| $x_{80}$ | $y_{80}$ | $z_{80}$ | $x_{81}$ | $y_{81}$ | $z_{81}$ | $x_{82}$ | $y_{82}$ |
| $z_{82}$ | $x_{83}$ | $y_{83}$ | $z_{83}$ | $x_{84}$ | $y_{84}$ | $z_{84}$ | $x_{85}$ |
| $y_{85}$ | $z_{85}$ | $x_{86}$ | $y_{86}$ | $z_{86}$ | $x_{87}$ | $y_{87}$ | $z_{87}$ |
| $x_{88}$ | $y_{88}$ | $z_{88}$ | $x_{89}$ | $y_{89}$ | $z_{89}$ | $x_{90}$ | $y_{90}$ |
| $z_{90}$ | $x_{91}$ | $y_{91}$ | $z_{91}$ | $x_{92}$ | $y_{92}$ | $z_{92}$ | $x_{93}$ |
| $y_{93}$ | $z_{93}$ | $x_{94}$ | $y_{94}$ | $z_{94}$ | $x_{95}$ | $y_{95}$ | $z_{95}$ |

FIG.9b

| | | | | | | | |
|---|---|---|---|---|---|---|---|
| $x_0$ | $y_0$ | $z_0$ | $x_1$ | $y_1$ | $z_1$ | $x_2$ | $y_2$ |
| $z_2$ | $x_3$ | $y_3$ | $z_3$ | $x_4$ | $y_4$ | $z_4$ | $x_5$ |
| $y_5$ | $z_5$ | $x_6$ | $y_6$ | $z_6$ | $x_7$ | $y_7$ | $z_7$ |
| $x_8$ | $y_8$ | $z_8$ | $x_9$ | $y_9$ | $z_9$ | $x_{10}$ | $y_{10}$ |
| $z_{10}$ | $x_{11}$ | $y_{11}$ | $z_{11}$ | $x_{12}$ | $y_{12}$ | $z_{12}$ | $x_{13}$ |
| $y_{13}$ | $z_{13}$ | $x_{14}$ | $y_{14}$ | $z_{14}$ | $x_{15}$ | $y_{15}$ | $z_{15}$ |
| $x_{16}$ | $y_{16}$ | $z_{16}$ | $x_{17}$ | $y_{17}$ | $z_{17}$ | $x_{18}$ | $y_{18}$ |
| $z_{18}$ | $x_{19}$ | $y_{19}$ | $z_{19}$ | $x_{20}$ | $y_{20}$ | $z_{20}$ | $x_{21}$ |
| $y_{21}$ | $z_{21}$ | $x_{22}$ | $y_{22}$ | $z_{22}$ | $x_{23}$ | $y_{23}$ | $z_{23}$ |
| $x_{24}$ | $y_{24}$ | $z_{24}$ | $x_{25}$ | $y_{25}$ | $z_{25}$ | $x_{26}$ | $y_{26}$ |
| $z_{26}$ | $x_{27}$ | $y_{27}$ | $z_{27}$ | $x_{28}$ | $y_{28}$ | $z_{28}$ | $x_{29}$ |
| $y_{29}$ | $z_{29}$ | $x_{30}$ | $y_{30}$ | $z_{30}$ | $x_{31}$ | $y_{31}$ | $z_{31}$ |
| $x_{32}$ | $y_{32}$ | $z_{32}$ | $x_{33}$ | $y_{33}$ | $z_{33}$ | $x_{34}$ | $y_{34}$ |
| $z_{34}$ | $x_{35}$ | $y_{35}$ | $z_{35}$ | $x_{36}$ | $y_{36}$ | $z_{36}$ | $x_{37}$ |
| $y_{37}$ | $z_{37}$ | $x_{38}$ | $y_{38}$ | $z_{38}$ | $x_{39}$ | $y_{39}$ | $z_{39}$ |
| $x_{40}$ | $y_{40}$ | $z_{40}$ | $x_{41}$ | $y_{41}$ | $z_{41}$ | $x_{42}$ | $y_{42}$ |
| $z_{42}$ | $x_{43}$ | $y_{43}$ | $z_{43}$ | $x_{44}$ | $y_{44}$ | $z_{44}$ | $x_{45}$ |
| $y_{45}$ | $z_{45}$ | $x_{46}$ | $y_{46}$ | $z_{46}$ | $x_{47}$ | $y_{47}$ | $z_{47}$ |
| $x_{48}$ | $y_{48}$ | $z_{48}$ | $x_{49}$ | $y_{49}$ | $z_{49}$ | $x_{50}$ | $y_{50}$ |
| $z_{50}$ | $x_{51}$ | $y_{51}$ | $z_{51}$ | $x_{52}$ | $y_{52}$ | $z_{52}$ | $x_{53}$ |
| $y_{53}$ | $z_{53}$ | $x_{54}$ | $y_{54}$ | $z_{54}$ | $x_{55}$ | $y_{55}$ | $z_{55}$ |
| $x_{56}$ | $y_{56}$ | $z_{56}$ | $x_{57}$ | $y_{57}$ | $z_{57}$ | $x_{58}$ | $y_{58}$ |
| $z_{58}$ | $x_{59}$ | $y_{59}$ | $z_{59}$ | $x_{60}$ | $y_{60}$ | $z_{60}$ | $x_{61}$ |
| $y_{61}$ | $z_{61}$ | $x_{62}$ | $y_{62}$ | $z_{62}$ | $x_{63}$ | $y_{63}$ | $z_{63}$ |
| $x_{64}$ | $y_{64}$ | $z_{64}$ | $x_{65}$ | $y_{65}$ | $z_{65}$ | $x_{66}$ | $y_{66}$ |
| $z_{66}$ | $x_{67}$ | $y_{67}$ | $z_{67}$ | $x_{68}$ | $y_{68}$ | $z_{68}$ | $x_{69}$ |
| $y_{69}$ | $z_{69}$ | $x_{70}$ | $y_{70}$ | $z_{70}$ | $x_{71}$ | $y_{71}$ | $z_{71}$ |
| $x_{72}$ | $y_{72}$ | $z_{72}$ | $x_{73}$ | $y_{73}$ | $z_{73}$ | $x_{74}$ | $y_{74}$ |
| $z_{74}$ | $x_{75}$ | $y_{75}$ | $z_{75}$ | $x_{76}$ | $y_{76}$ | $z_{76}$ | $x_{77}$ |
| $y_{77}$ | $z_{77}$ | $x_{78}$ | $y_{78}$ | $z_{78}$ | $x_{79}$ | $y_{79}$ | $z_{79}$ |
| $x_{80}$ | $y_{80}$ | $z_{80}$ | $x_{81}$ | $y_{81}$ | $z_{81}$ | $x_{82}$ | $y_{82}$ |
| $z_{82}$ | $x_{83}$ | $y_{83}$ | $z_{83}$ | $x_{84}$ | $y_{84}$ | $z_{84}$ | $x_{85}$ |
| $y_{85}$ | $z_{85}$ | $x_{86}$ | $y_{86}$ | $z_{86}$ | $x_{87}$ | $y_{87}$ | $z_{87}$ |
| $x_{88}$ | $y_{88}$ | $z_{88}$ | $x_{89}$ | $y_{89}$ | $z_{89}$ | $x_{90}$ | $y_{90}$ |
| $z_{90}$ | $x_{91}$ | $y_{91}$ | $z_{91}$ | $x_{92}$ | $y_{92}$ | $z_{92}$ | $x_{93}$ |
| $y_{93}$ | $z_{93}$ | $x_{94}$ | $y_{94}$ | $z_{94}$ | $x_{95}$ | $y_{95}$ | $z_{95}$ |

FIG.9c

| | | | | | | | |
|---|---|---|---|---|---|---|---|
| $x_0$ | $y_0$ | $z_0$ | $x_1$ | $y_1$ | $z_1$ | $x_2$ | $y_2$ |
| $z_2$ | $x_3$ | $y_3$ | $z_3$ | $x_4$ | $y_4$ | $z_4$ | $x_5$ |
| $y_5$ | $z_5$ | $x_6$ | $y_6$ | $z_6$ | $x_7$ | $y_7$ | $z_7$ |
| $x_8$ | $y_8$ | $z_8$ | $x_9$ | $y_9$ | $z_9$ | $x_{10}$ | $y_{10}$ |
| $z_{10}$ | $x_{11}$ | $y_{11}$ | $z_{11}$ | $x_{12}$ | $y_{12}$ | $z_{12}$ | $x_{13}$ |
| $y_{13}$ | $z_{13}$ | $x_{14}$ | $y_{14}$ | $z_{14}$ | $x_{15}$ | $y_{15}$ | $z_{15}$ |
| $x_{16}$ | $y_{16}$ | $z_{16}$ | $x_{17}$ | $y_{17}$ | $z_{17}$ | $x_{18}$ | $y_{18}$ |
| $z_{18}$ | $x_{19}$ | $y_{19}$ | $z_{19}$ | $x_{20}$ | $y_{20}$ | $z_{20}$ | $x_{21}$ |
| $y_{21}$ | $z_{21}$ | $x_{22}$ | $y_{22}$ | $z_{22}$ | $x_{23}$ | $y_{23}$ | $z_{23}$ |
| $x_{24}$ | $y_{24}$ | $z_{24}$ | $x_{25}$ | $y_{25}$ | $z_{25}$ | $x_{26}$ | $y_{26}$ |
| $z_{26}$ | $x_{27}$ | $y_{27}$ | $z_{27}$ | $x_{28}$ | $y_{28}$ | $z_{28}$ | $x_{29}$ |
| $y_{29}$ | $z_{29}$ | $x_{30}$ | $y_{30}$ | $z_{30}$ | $x_{31}$ | $y_{31}$ | $z_{31}$ |
| $x_{32}$ | $y_{32}$ | $z_{32}$ | $x_{33}$ | $y_{33}$ | $z_{33}$ | $x_{34}$ | $y_{34}$ |
| $z_{34}$ | $x_{35}$ | $y_{35}$ | $z_{35}$ | $x_{36}$ | $y_{36}$ | $z_{36}$ | $x_{37}$ |
| $y_{37}$ | $z_{37}$ | $x_{38}$ | $y_{38}$ | $z_{38}$ | $x_{39}$ | $y_{39}$ | $z_{39}$ |
| $x_{40}$ | $y_{40}$ | $z_{40}$ | $x_{41}$ | $y_{41}$ | $z_{41}$ | $x_{42}$ | $y_{42}$ |
| $z_{42}$ | $x_{43}$ | $y_{43}$ | $z_{43}$ | $x_{44}$ | $y_{44}$ | $z_{44}$ | $x_{45}$ |
| $y_{45}$ | $z_{45}$ | $x_{46}$ | $y_{46}$ | $z_{46}$ | $x_{47}$ | $y_{47}$ | $z_{47}$ |
| $x_{48}$ | $y_{48}$ | $z_{48}$ | $x_{49}$ | $y_{49}$ | $z_{49}$ | $x_{50}$ | $y_{50}$ |
| $z_{50}$ | $x_{51}$ | $y_{51}$ | $z_{51}$ | $x_{52}$ | $y_{52}$ | $z_{52}$ | $x_{53}$ |
| $y_{53}$ | $z_{53}$ | $x_{54}$ | $y_{54}$ | $z_{54}$ | $x_{55}$ | $y_{55}$ | $z_{55}$ |
| $x_{56}$ | $y_{56}$ | $z_{56}$ | $x_{57}$ | $y_{57}$ | $z_{57}$ | $x_{58}$ | $y_{58}$ |
| $z_{58}$ | $x_{59}$ | $y_{59}$ | $z_{59}$ | $x_{60}$ | $y_{60}$ | $z_{60}$ | $x_{61}$ |
| $y_{61}$ | $z_{61}$ | $x_{62}$ | $y_{62}$ | $z_{62}$ | $x_{63}$ | $y_{63}$ | $z_{63}$ |
| $x_{64}$ | $y_{64}$ | $z_{64}$ | $x_{65}$ | $y_{65}$ | $z_{65}$ | $x_{66}$ | $y_{66}$ |
| $z_{66}$ | $x_{67}$ | $y_{67}$ | $z_{67}$ | $x_{68}$ | $y_{68}$ | $z_{68}$ | $x_{69}$ |
| $y_{69}$ | $z_{69}$ | $x_{70}$ | $y_{70}$ | $z_{70}$ | $x_{71}$ | $y_{71}$ | $z_{71}$ |
| $x_{72}$ | $y_{72}$ | $z_{72}$ | $x_{73}$ | $y_{73}$ | $z_{73}$ | $x_{74}$ | $y_{74}$ |
| $z_{74}$ | $x_{75}$ | $y_{75}$ | $z_{75}$ | $x_{76}$ | $y_{76}$ | $z_{76}$ | $x_{77}$ |
| $y_{77}$ | $z_{77}$ | $x_{78}$ | $y_{78}$ | $z_{78}$ | $x_{79}$ | $y_{79}$ | $z_{79}$ |
| $x_{80}$ | $y_{80}$ | $z_{80}$ | $x_{81}$ | $y_{81}$ | $z_{81}$ | $x_{82}$ | $y_{82}$ |
| $z_{82}$ | $x_{83}$ | $y_{83}$ | $z_{83}$ | $x_{84}$ | $y_{84}$ | $z_{84}$ | $x_{85}$ |
| $y_{85}$ | $z_{85}$ | $x_{86}$ | $y_{86}$ | $z_{86}$ | $x_{87}$ | $y_{87}$ | $z_{87}$ |
| $x_{88}$ | $y_{88}$ | $z_{88}$ | $x_{89}$ | $y_{89}$ | $z_{89}$ | $x_{90}$ | $y_{90}$ |
| $z_{90}$ | $x_{91}$ | $y_{91}$ | $z_{91}$ | $x_{92}$ | $y_{92}$ | $z_{92}$ | $x_{93}$ |
| $y_{93}$ | $z_{93}$ | $x_{94}$ | $y_{94}$ | $z_{94}$ | $x_{95}$ | $y_{95}$ | $z_{95}$ |

FIG.10a

| 1 | 4 | 7 | 2 | 5 | 0 | 3 | 6 |
|---|---|---|---|---|---|---|---|
| $y_0$ | $y_1$ | $y_2$ | $y_3$ | $y_4$ | $y_5$ | $y_6$ | $y_7$ |
| $y_8$ | $y_9$ | $y_{10}$ | $y_{11}$ | $y_{12}$ | $y_{13}$ | $y_{14}$ | $y_{15}$ |
| $y_{16}$ | $y_{17}$ | $y_{18}$ | $y_{19}$ | $y_{20}$ | $y_{21}$ | $y_{22}$ | $y_{23}$ |
| $y_{24}$ | $y_{25}$ | $y_{26}$ | $y_{27}$ | $y_{28}$ | $y_{29}$ | $y_{30}$ | $y_{31}$ |
| $y_{32}$ | $y_{33}$ | $y_{34}$ | $y_{35}$ | $y_{36}$ | $y_{37}$ | $y_{38}$ | $y_{39}$ |
| $y_{40}$ | $y_{41}$ | $y_{42}$ | $y_{43}$ | $y_{44}$ | $y_{45}$ | $y_{46}$ | $y_{47}$ |
| $y_{48}$ | $y_{49}$ | $y_{50}$ | $y_{51}$ | $y_{52}$ | $y_{53}$ | $y_{54}$ | $y_{55}$ |
| $y_{56}$ | $y_{57}$ | $y_{58}$ | $y_{59}$ | $y_{60}$ | $y_{61}$ | $y_{62}$ | $y_{63}$ |
| $y_{64}$ | $y_{65}$ | $y_{66}$ | $y_{67}$ | $y_{68}$ | $y_{69}$ | $y_{70}$ | $y_{71}$ |
| $y_{72}$ | $y_{73}$ | $y_{74}$ | $y_{75}$ | $y_{76}$ | $y_{77}$ | $y_{78}$ | $y_{79}$ |
| $y_{80}$ | $y_{81}$ | $y_{82}$ | $y_{83}$ | $y_{84}$ | $y_{85}$ | $y_{86}$ | $y_{87}$ |
| $y_{88}$ | $y_{89}$ | $y_{90}$ | $y_{91}$ | $y_{92}$ | $y_{93}$ | $y_{94}$ | $y_{95}$ |

FIG.10b

| 2 | 5 | 0 | 3 | 6 | 1 | 4 | 7 |
|---|---|---|---|---|---|---|---|
| $z_0$ | $z_1$ | $z_2$ | $z_3$ | $z_4$ | $z_5$ | $z_6$ | $z_7$ |
| $z_8$ | $z_9$ | $z_{10}$ | $z_{11}$ | $z_{12}$ | $z_{13}$ | $z_{14}$ | $z_{15}$ |
| $z_{16}$ | $z_{17}$ | $z_{18}$ | $z_{19}$ | $z_{20}$ | $z_{21}$ | $z_{22}$ | $z_{23}$ |
| $z_{24}$ | $z_{25}$ | $z_{26}$ | $z_{27}$ | $z_{28}$ | $z_{29}$ | $z_{30}$ | $z_{31}$ |
| $z_{32}$ | $z_{33}$ | $z_{34}$ | $z_{35}$ | $z_{36}$ | $z_{37}$ | $z_{38}$ | $z_{39}$ |
| $z_{40}$ | $z_{41}$ | $z_{42}$ | $z_{43}$ | $z_{44}$ | $z_{45}$ | $z_{46}$ | $z_{47}$ |
| $z_{48}$ | $z_{49}$ | $z_{50}$ | $z_{51}$ | $z_{52}$ | $z_{53}$ | $z_{54}$ | $z_{55}$ |
| $z_{56}$ | $z_{57}$ | $z_{58}$ | $z_{59}$ | $z_{60}$ | $z_{61}$ | $z_{62}$ | $z_{63}$ |
| $z_{64}$ | $z_{65}$ | $z_{66}$ | $z_{67}$ | $z_{68}$ | $z_{69}$ | $z_{70}$ | $z_{71}$ |
| $z_{72}$ | $z_{73}$ | $z_{74}$ | $z_{75}$ | $z_{76}$ | $z_{77}$ | $z_{78}$ | $z_{79}$ |
| $z_{80}$ | $z_{81}$ | $z_{82}$ | $z_{83}$ | $z_{84}$ | $z_{85}$ | $z_{86}$ | $z_{87}$ |
| $z_{88}$ | $z_{89}$ | $z_{90}$ | $z_{91}$ | $z_{92}$ | $z_{93}$ | $z_{94}$ | $z_{95}$ |

FIG.10c

| | | | | | | | |
|---|---|---|---|---|---|---|---|
| $x_0$ | $y_0$ | $z_0$ | $x_1$ | $y_1$ | $z_1$ | $x_2$ | $y_2$ |
| $z_2$ | $x_3$ | $y_3$ | $z_3$ | $x_4$ | $y_4$ | $z_4$ | $x_5$ |
| $y_5$ | $z_5$ | $x_6$ | $y_6$ | $z_6$ | $x_7$ | $y_7$ | $z_7$ |
| $x_8$ | $y_8$ | $z_8$ | $x_9$ | $y_9$ | $z_9$ | $x_{10}$ | $y_{10}$ |
| $z_{10}$ | $x_{11}$ | $y_{11}$ | $z_{11}$ | $x_{12}$ | $y_{12}$ | $z_{12}$ | $x_{13}$ |
| $y_{13}$ | $z_{13}$ | $x_{14}$ | $y_{14}$ | $z_{14}$ | $x_{15}$ | $y_{15}$ | $z_{15}$ |
| $x_{16}$ | $y_{16}$ | $z_{16}$ | $x_{17}$ | $y_{17}$ | $z_{17}$ | $x_{18}$ | $y_{18}$ |
| $z_{18}$ | $x_{19}$ | $y_{19}$ | $z_{19}$ | $x_{20}$ | $y_{20}$ | $z_{20}$ | $x_{21}$ |
| $y_{21}$ | $z_{21}$ | $x_{22}$ | $y_{22}$ | $z_{22}$ | $x_{23}$ | $y_{23}$ | $z_{23}$ |
| $x_{24}$ | $y_{24}$ | $z_{24}$ | $x_{25}$ | $y_{25}$ | $z_{25}$ | $x_{26}$ | $y_{26}$ |
| $z_{26}$ | $x_{27}$ | $y_{27}$ | $z_{27}$ | $x_{28}$ | $y_{28}$ | $z_{28}$ | $x_{29}$ |
| $y_{29}$ | $z_{29}$ | $x_{30}$ | $y_{30}$ | $z_{30}$ | $x_{31}$ | $y_{31}$ | $z_{31}$ |
| $x_{32}$ | $y_{32}$ | $z_{32}$ | $x_{33}$ | $y_{33}$ | $z_{33}$ | $x_{34}$ | $y_{34}$ |
| $z_{34}$ | $x_{35}$ | $y_{35}$ | $z_{35}$ | $x_{36}$ | $y_{36}$ | $z_{36}$ | $x_{37}$ |
| $y_{37}$ | $z_{37}$ | $x_{38}$ | $y_{38}$ | $z_{38}$ | $x_{39}$ | $y_{39}$ | $z_{39}$ |
| $x_{40}$ | $y_{40}$ | $z_{40}$ | $x_{41}$ | $y_{41}$ | $z_{41}$ | $x_{42}$ | $y_{42}$ |
| $z_{42}$ | $x_{43}$ | $y_{43}$ | $z_{43}$ | $x_{44}$ | $y_{44}$ | $z_{44}$ | $x_{45}$ |
| $y_{45}$ | $z_{45}$ | $x_{46}$ | $y_{46}$ | $z_{46}$ | $x_{47}$ | $y_{47}$ | $z_{47}$ |
| $x_{48}$ | $y_{48}$ | $z_{48}$ | $x_{49}$ | $y_{49}$ | $z_{49}$ | $x_{50}$ | $y_{50}$ |
| $z_{50}$ | $x_{51}$ | $y_{51}$ | $z_{51}$ | $x_{52}$ | $y_{52}$ | $z_{52}$ | $x_{53}$ |
| $y_{53}$ | $z_{53}$ | $x_{54}$ | $y_{54}$ | $z_{54}$ | $x_{55}$ | $y_{55}$ | $z_{55}$ |
| $x_{56}$ | $y_{56}$ | $z_{56}$ | $x_{57}$ | $y_{57}$ | $z_{57}$ | $x_{58}$ | $y_{58}$ |
| $z_{58}$ | $x_{59}$ | $y_{59}$ | $z_{59}$ | $x_{60}$ | $y_{60}$ | $z_{60}$ | $x_{61}$ |
| $y_{61}$ | $z_{61}$ | $x_{62}$ | $y_{62}$ | $z_{62}$ | $x_{63}$ | $y_{63}$ | $z_{63}$ |
| $x_{64}$ | $y_{64}$ | $z_{64}$ | $x_{65}$ | $y_{65}$ | $z_{65}$ | $x_{66}$ | $y_{66}$ |
| $z_{66}$ | $x_{67}$ | $y_{67}$ | $z_{67}$ | $x_{68}$ | $y_{68}$ | $z_{68}$ | $x_{69}$ |
| $y_{69}$ | $z_{69}$ | $x_{70}$ | $y_{70}$ | $z_{70}$ | $x_{71}$ | $y_{71}$ | $z_{71}$ |
| $x_{72}$ | $y_{72}$ | $z_{72}$ | $x_{73}$ | $y_{73}$ | $z_{73}$ | $x_{74}$ | $y_{74}$ |
| $z_{74}$ | $x_{75}$ | $y_{75}$ | $z_{75}$ | $x_{76}$ | $y_{76}$ | $z_{76}$ | $x_{77}$ |
| $y_{77}$ | $z_{77}$ | $x_{78}$ | $y_{78}$ | $z_{78}$ | $x_{79}$ | $y_{79}$ | $z_{79}$ |
| $x_{80}$ | $y_{80}$ | $z_{80}$ | $x_{81}$ | $y_{81}$ | $z_{81}$ | $x_{82}$ | $y_{82}$ |
| $z_{82}$ | $x_{83}$ | $y_{83}$ | $z_{83}$ | $x_{84}$ | $y_{84}$ | $z_{84}$ | $x_{85}$ |
| $y_{85}$ | $z_{85}$ | $x_{86}$ | $y_{86}$ | $z_{86}$ | $x_{87}$ | $y_{87}$ | $z_{87}$ |
| $x_{88}$ | $y_{88}$ | $z_{88}$ | $x_{89}$ | $y_{89}$ | $z_{89}$ | $x_{90}$ | $y_{90}$ |
| $z_{90}$ | $x_{91}$ | $y_{91}$ | $z_{91}$ | $x_{92}$ | $y_{92}$ | $z_{92}$ | $x_{93}$ |
| $y_{93}$ | $z_{93}$ | $x_{94}$ | $y_{94}$ | $z_{94}$ | $x_{95}$ | $y_{95}$ | $z_{95}$ |

FIG.11a

| 1 | 4 | 7 | 2 | 5 | 0 | 3 | 6 |
|---|---|---|---|---|---|---|---|
| $y_0$ | $y_1$ | $y_2$ | $y_3$ | $y_4$ | $y_5$ | $y_6$ | $y_7$ |
| $y_8$ | $y_9$ | $y_{10}$ | $y_{11}$ | $y_{12}$ | $y_{13}$ | $y_{14}$ | $y_{15}$ |
| $y_{16}$ | $y_{17}$ | $y_{18}$ | $y_{19}$ | $y_{20}$ | $y_{21}$ | $y_{22}$ | $y_{23}$ |
| $y_{24}$ | $y_{25}$ | $y_{26}$ | $y_{27}$ | $y_{28}$ | $y_{29}$ | $y_{30}$ | $y_{31}$ |
| $y_{32}$ | $y_{33}$ | $y_{34}$ | $y_{35}$ | $y_{36}$ | $y_{37}$ | $y_{38}$ | $y_{39}$ |
| $y_{40}$ | $y_{41}$ | $y_{42}$ | $y_{43}$ | $y_{44}$ | $y_{45}$ | $y_{46}$ | $y_{47}$ |
| $y_{48}$ | $y_{49}$ | $y_{50}$ | $y_{51}$ | $y_{52}$ | $y_{53}$ | $y_{54}$ | $y_{55}$ |
| $y_{56}$ | $y_{57}$ | $y_{58}$ | $y_{59}$ | $y_{60}$ | $y_{61}$ | $y_{62}$ | $y_{63}$ |
| $y_{64}$ | $y_{65}$ | $y_{66}$ | $y_{67}$ | $y_{68}$ | $y_{69}$ | $y_{70}$ | $y_{71}$ |
| $y_{72}$ | $y_{73}$ | $y_{74}$ | $y_{75}$ | $y_{76}$ | $y_{77}$ | $y_{78}$ | $y_{79}$ |
| $y_{80}$ | $y_{81}$ | $y_{82}$ | $y_{83}$ | $y_{84}$ | $y_{85}$ | $y_{86}$ | $y_{87}$ |
| $y_{88}$ | $y_{89}$ | $y_{90}$ | $y_{91}$ | $y_{92}$ | $y_{93}$ | $y_{94}$ | $y_{95}$ |

FIG.11b

| 2 | 5 | 0 | 3 | 6 | 1 | 4 | 7 |
|---|---|---|---|---|---|---|---|
| $z_0$ | $z_1$ | $z_2$ | $z_3$ | $z_4$ | $z_5$ | $z_6$ | $z_7$ |
| $z_8$ | $z_9$ | $z_{10}$ | $z_{11}$ | $z_{12}$ | $z_{13}$ | $z_{14}$ | $z_{15}$ |
| $z_{16}$ | $z_{17}$ | $z_{18}$ | $z_{19}$ | $z_{20}$ | $z_{21}$ | $z_{22}$ | $z_{23}$ |
| $z_{24}$ | $z_{25}$ | $z_{26}$ | $z_{27}$ | $z_{28}$ | $z_{29}$ | $z_{30}$ | $z_{31}$ |
| $z_{32}$ | $z_{33}$ | $z_{34}$ | $z_{35}$ | $z_{36}$ | $z_{37}$ | $z_{38}$ | $z_{39}$ |
| $z_{40}$ | $z_{41}$ | $z_{42}$ | $z_{43}$ | $z_{44}$ | $z_{45}$ | $z_{46}$ | $z_{47}$ |
| $z_{48}$ | $z_{49}$ | $z_{50}$ | $z_{51}$ | $z_{52}$ | $z_{53}$ | $z_{54}$ | $z_{55}$ |
| $z_{56}$ | $z_{57}$ | $z_{58}$ | $z_{59}$ | $z_{60}$ | $z_{61}$ | $z_{62}$ | $z_{63}$ |
| $z_{64}$ | $z_{65}$ | $z_{66}$ | $z_{67}$ | $z_{68}$ | $z_{69}$ | $z_{70}$ | $z_{71}$ |
| $z_{72}$ | $z_{73}$ | $z_{74}$ | $z_{75}$ | $z_{76}$ | $z_{77}$ | $z_{78}$ | $z_{79}$ |
| $z_{80}$ | $z_{81}$ | $z_{82}$ | $z_{83}$ | $z_{84}$ | $z_{85}$ | $z_{86}$ | $z_{87}$ |
| $z_{88}$ | $z_{89}$ | $z_{90}$ | $z_{91}$ | $z_{92}$ | $z_{93}$ | $z_{94}$ | $z_{95}$ |

FIG.11c

| $x_0$ | $y_0$ | $z_0$ | $x_1$ | $y_1$ | $z_1$ | $x_2$ | $y_2$ |
|---|---|---|---|---|---|---|---|
| $z_2$ | $x_3$ | $y_3$ | $z_3$ | $x_4$ | $y_4$ | $z_4$ | $x_5$ |
| $y_5$ | $z_5$ | $x_6$ | $y_6$ | $z_6$ | $x_7$ | $y_7$ | $z_7$ |
| $x_8$ | $y_8$ | $z_8$ | $x_9$ | $y_9$ | $z_9$ | $x_{10}$ | $y_{10}$ |
| $z_{10}$ | $x_{11}$ | $y_{11}$ | $z_{11}$ | $x_{12}$ | $y_{12}$ | $z_{12}$ | $x_{13}$ |
| $y_{13}$ | $z_{13}$ | $x_{14}$ | $y_{14}$ | $z_{14}$ | $x_{15}$ | $y_{15}$ | $z_{15}$ |
| $x_{16}$ | $y_{16}$ | $z_{16}$ | $x_{17}$ | $y_{17}$ | $z_{17}$ | $x_{18}$ | $y_{18}$ |
| $z_{18}$ | $x_{19}$ | $y_{19}$ | $z_{19}$ | $x_{20}$ | $y_{20}$ | $z_{20}$ | $x_{21}$ |
| $y_{21}$ | $z_{21}$ | $x_{22}$ | $y_{22}$ | $z_{22}$ | $x_{23}$ | $y_{23}$ | $z_{23}$ |
| $x_{24}$ | $y_{24}$ | $z_{24}$ | $x_{25}$ | $y_{25}$ | $z_{25}$ | $x_{26}$ | $y_{26}$ |
| $z_{26}$ | $x_{27}$ | $y_{27}$ | $z_{27}$ | $x_{28}$ | $y_{28}$ | $z_{28}$ | $x_{29}$ |
| $y_{29}$ | $z_{29}$ | $x_{30}$ | $y_{30}$ | $z_{30}$ | $x_{31}$ | $y_{31}$ | $z_{31}$ |
| $x_{32}$ | $y_{32}$ | $z_{32}$ | $x_{33}$ | $y_{33}$ | $z_{33}$ | $x_{34}$ | $y_{34}$ |
| $z_{34}$ | $x_{35}$ | $y_{35}$ | $z_{35}$ | $x_{36}$ | $y_{36}$ | $z_{36}$ | $x_{37}$ |
| $y_{37}$ | $z_{37}$ | $x_{38}$ | $y_{38}$ | $z_{38}$ | $x_{39}$ | $y_{39}$ | $z_{39}$ |
| $x_{40}$ | $y_{40}$ | $z_{40}$ | $x_{41}$ | $y_{41}$ | $z_{41}$ | $x_{42}$ | $y_{42}$ |
| $z_{42}$ | $x_{43}$ | $y_{43}$ | $z_{43}$ | $x_{44}$ | $y_{44}$ | $z_{44}$ | $x_{45}$ |
| $y_{45}$ | $z_{45}$ | $x_{46}$ | $y_{46}$ | $z_{46}$ | $x_{47}$ | $y_{47}$ | $z_{47}$ |
| $x_{48}$ | $y_{48}$ | $z_{48}$ | $x_{49}$ | $y_{49}$ | $z_{49}$ | $x_{50}$ | $y_{50}$ |
| $z_{50}$ | $x_{51}$ | $y_{51}$ | $z_{51}$ | $x_{52}$ | $y_{52}$ | $z_{52}$ | $x_{53}$ |
| $y_{53}$ | $z_{53}$ | $x_{54}$ | $y_{54}$ | $z_{54}$ | $x_{55}$ | $y_{55}$ | $z_{55}$ |
| $x_{56}$ | $y_{56}$ | $z_{56}$ | $x_{57}$ | $y_{57}$ | $z_{57}$ | $x_{58}$ | $y_{58}$ |
| $z_{58}$ | $x_{59}$ | $y_{59}$ | $z_{59}$ | $x_{60}$ | $y_{60}$ | $z_{60}$ | $x_{61}$ |
| $y_{61}$ | $z_{61}$ | $x_{62}$ | $y_{62}$ | $z_{62}$ | $x_{63}$ | $y_{63}$ | $z_{63}$ |
| $x_{64}$ | $y_{64}$ | $z_{64}$ | $x_{65}$ | $y_{65}$ | $z_{65}$ | $x_{66}$ | $y_{66}$ |
| $z_{66}$ | $x_{67}$ | $y_{67}$ | $z_{67}$ | $x_{68}$ | $y_{68}$ | $z_{68}$ | $x_{69}$ |
| $y_{69}$ | $z_{69}$ | $x_{70}$ | $y_{70}$ | $z_{70}$ | $x_{71}$ | $y_{71}$ | $z_{71}$ |
| $x_{72}$ | $y_{72}$ | $z_{72}$ | $x_{73}$ | $y_{73}$ | $z_{73}$ | $x_{74}$ | $y_{74}$ |
| $z_{74}$ | $x_{75}$ | $y_{75}$ | $z_{75}$ | $x_{76}$ | $y_{76}$ | $z_{76}$ | $x_{77}$ |
| $y_{77}$ | $z_{77}$ | $x_{78}$ | $y_{78}$ | $z_{78}$ | $x_{79}$ | $y_{79}$ | $z_{79}$ |
| $x_{80}$ | $y_{80}$ | $z_{80}$ | $x_{81}$ | $y_{81}$ | $z_{81}$ | $x_{82}$ | $y_{82}$ |
| $z_{82}$ | $x_{83}$ | $y_{83}$ | $z_{83}$ | $x_{84}$ | $y_{84}$ | $z_{84}$ | $x_{85}$ |
| $y_{85}$ | $z_{85}$ | $x_{86}$ | $y_{86}$ | $z_{86}$ | $x_{87}$ | $y_{87}$ | $z_{87}$ |
| $x_{88}$ | $y_{88}$ | $z_{88}$ | $x_{89}$ | $y_{89}$ | $z_{89}$ | $x_{90}$ | $y_{90}$ |
| $z_{90}$ | $x_{91}$ | $y_{91}$ | $z_{91}$ | $x_{92}$ | $y_{92}$ | $z_{92}$ | $x_{93}$ |
| $y_{93}$ | $z_{93}$ | $x_{94}$ | $y_{94}$ | $z_{94}$ | $x_{95}$ | $y_{95}$ | $z_{95}$ |

FIG.12

| | | | | | | | |
|---|---|---|---|---|---|---|---|
| $x_0$ | $y_0$ | $z_0$ | $x_1$ | $y_1$ | $z_1$ | $x_2$ | $y_2$ |
| $z_2$ | $x_3$ | $y_3$ | $z_3$ | $x_4$ | $y_4$ | $z_4$ | $x_5$ |
| $y_5$ | $z_5$ | $x_6$ | $y_6$ | $z_6$ | $x_7$ | $y_7$ | $z_7$ |
| $x_8$ | $y_8$ | $z_8$ | $x_9$ | $y_9$ | $z_9$ | $x_{10}$ | $y_{10}$ |
| $z_{10}$ | $x_{11}$ | $y_{11}$ | $z_{11}$ | $x_{12}$ | $y_{12}$ | $z_{12}$ | $x_{13}$ |
| $y_{13}$ | $z_{13}$ | $x_{14}$ | $y_{14}$ | $z_{14}$ | $x_{15}$ | $y_{15}$ | $z_{15}$ |
| $x_{16}$ | $y_{16}$ | $z_{16}$ | $x_{17}$ | $y_{17}$ | $z_{17}$ | $x_{18}$ | $y_{18}$ |
| $z_{18}$ | $x_{19}$ | $y_{19}$ | $z_{19}$ | $x_{20}$ | $y_{20}$ | $z_{20}$ | $x_{21}$ |
| $y_{21}$ | $z_{21}$ | $x_{22}$ | $y_{22}$ | $z_{22}$ | $x_{23}$ | $y_{23}$ | $z_{23}$ |
| $x_{24}$ | $y_{24}$ | $z_{24}$ | $x_{25}$ | $y_{25}$ | $z_{25}$ | $x_{26}$ | $y_{26}$ |
| $z_{26}$ | $x_{27}$ | $y_{27}$ | $z_{27}$ | $x_{28}$ | $y_{28}$ | $z_{28}$ | $x_{29}$ |
| $y_{29}$ | $z_{29}$ | $x_{30}$ | $y_{30}$ | $z_{30}$ | $x_{31}$ | $y_{31}$ | $z_{31}$ |
| $x_{32}$ | $y_{32}$ | $z_{32}$ | $x_{33}$ | $y_{33}$ | $z_{33}$ | $x_{34}$ | $y_{34}$ |
| $z_{34}$ | $x_{35}$ | $y_{35}$ | $z_{35}$ | $x_{36}$ | $y_{36}$ | $z_{36}$ | $x_{37}$ |
| $y_{37}$ | $z_{37}$ | $x_{38}$ | $y_{38}$ | $z_{38}$ | $x_{39}$ | $y_{39}$ | $z_{39}$ |
| $x_{40}$ | $y_{40}$ | $z_{40}$ | $x_{41}$ | $y_{41}$ | $z_{41}$ | $x_{42}$ | $y_{42}$ |
| $z_{42}$ | $x_{43}$ | $y_{43}$ | $z_{43}$ | $x_{44}$ | $y_{44}$ | $z_{44}$ | $x_{45}$ |
| $y_{45}$ | $z_{45}$ | $x_{46}$ | $y_{46}$ | $z_{46}$ | $x_{47}$ | $y_{47}$ | $z_{47}$ |
| $x_{48}$ | $y_{48}$ | $z_{48}$ | $x_{49}$ | $y_{49}$ | $z_{49}$ | $x_{50}$ | $y_{50}$ |
| $z_{50}$ | $x_{51}$ | $y_{51}$ | $z_{51}$ | $x_{52}$ | $y_{52}$ | $z_{52}$ | $x_{53}$ |
| $y_{53}$ | $z_{53}$ | $x_{54}$ | $y_{54}$ | $z_{54}$ | $x_{55}$ | $y_{55}$ | $z_{55}$ |
| $x_{56}$ | $y_{56}$ | $z_{56}$ | $x_{57}$ | $y_{57}$ | $z_{57}$ | $x_{58}$ | $y_{58}$ |
| $z_{58}$ | $x_{59}$ | $y_{59}$ | $z_{59}$ | $x_{60}$ | $y_{60}$ | $z_{60}$ | $x_{61}$ |
| $y_{61}$ | $z_{61}$ | $x_{62}$ | $y_{62}$ | $z_{62}$ | $x_{63}$ | $y_{63}$ | $z_{63}$ |
| $x_{64}$ | $y_{64}$ | $z_{64}$ | $x_{65}$ | $y_{65}$ | $z_{65}$ | $x_{66}$ | $y_{66}$ |
| $z_{66}$ | $x_{67}$ | $y_{67}$ | $z_{67}$ | $x_{68}$ | $y_{68}$ | $z_{68}$ | $x_{69}$ |
| $y_{69}$ | $z_{69}$ | $x_{70}$ | $y_{70}$ | $z_{70}$ | $x_{71}$ | $y_{71}$ | $z_{71}$ |
| $x_{72}$ | $y_{72}$ | $z_{72}$ | $x_{73}$ | $y_{73}$ | $z_{73}$ | $x_{74}$ | $y_{74}$ |
| $z_{74}$ | $x_{75}$ | $y_{75}$ | $z_{75}$ | $x_{76}$ | $y_{76}$ | $z_{76}$ | $x_{77}$ |
| $y_{77}$ | $z_{77}$ | $x_{78}$ | $y_{78}$ | $z_{78}$ | $x_{79}$ | $y_{79}$ | $z_{79}$ |
| $x_{80}$ | $y_{80}$ | $z_{80}$ | $x_{81}$ | $y_{81}$ | $z_{81}$ | $x_{82}$ | $y_{82}$ |
| $z_{82}$ | $x_{83}$ | $y_{83}$ | $z_{83}$ | $x_{84}$ | $y_{84}$ | $z_{84}$ | $x_{85}$ |
| $y_{85}$ | $z_{85}$ | $x_{86}$ | $y_{86}$ | $z_{86}$ | $x_{87}$ | $y_{87}$ | $z_{87}$ |
| $x_{88}$ | $y_{88}$ | $z_{88}$ | $x_{89}$ | $y_{89}$ | $z_{89}$ | $x_{90}$ | $y_{90}$ |
| $z_{90}$ | $x_{91}$ | $y_{91}$ | $z_{91}$ | $x_{92}$ | $y_{92}$ | $z_{92}$ | $x_{93}$ |
| $y_{93}$ | $z_{93}$ | $x_{94}$ | $y_{94}$ | $z_{94}$ | $x_{95}$ | $y_{95}$ | $z_{95}$ |

FIG.13a

| information bits part | | | | | | | | tail bits part | | | |
|---|---|---|---|---|---|---|---|---|---|---|---|
| x | x | x | x | x | x | x | x | x | y | x | z |
| y | y | y | y | y | y | y | y | y | x | z | x |
| z | z | z | z | z | z | z | z | x | y | x | z |

FIG.13b

| information bits part | | | | | | | | tail bits part | | | |
|---|---|---|---|---|---|---|---|---|---|---|---|
| x | x | x | x | x | x | x | x | x | y | x | z |
| y | y | y | y | y | y | y | y | y | x | z | z |
| z | z | z | z | z | z | z | z | x | y | x | z |

FIG.14a

| 1 | 4 | 7 | 2 | 5 | 0 | 3 | 6 |
|---|---|---|---|---|---|---|---|
| 0 | 1 | 2 | 3 | 4 | 5 | 6 | 7 |
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |

FIG.14b

| 1 | 4 | 7 | 2 | 5 | 0 | 3 | 6 |
|---|---|---|---|---|---|---|---|
| 0 | 1 | 2 | 3 | 4 | 5 | 6 | 7 |
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |

FIG.15a

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |
| 64 | 65 | 66 | 67 | 68 | 69 | 70 | 71 |
| 72 | 73 | 74 | 75 | 76 | 77 | 78 | 79 |
| 80 | 81 | 82 | 83 | 84 | 85 | 86 | 87 |

FIG.15b

| 0  | 1  | 2  | 3  | 4  | 5  | 6  | 7  |
|----|----|----|----|----|----|----|----|
| 8  | 9  | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |
| 64 | 65 | 66 | 67 | 68 | 69 | 70 | 71 |
| 72 | 73 | 74 | 75 | 76 | 77 | 78 | 79 |
| 80 | 81 | 82 | 83 | 84 | 85 | 86 | 87 |

US 7,814,390 B2

RATE MATCHING METHOD IN MOBILE COMMUNICATION SYSTEM

RELATED APPLICATIONS

This application is a continuation of application Ser. No. 11/404,175, filed on Apr. 13, 2006, now U.S. Pat. No. 7,523,383, which is a continuation of application Ser. No. 10/622,781, filed on Jul. 21, 2003, now U.S. Pat. No. 7,089,480, which is a continuation of application Ser. No. 09/615,603, filed on Jul. 13, 2000, now U.S. Pat. No. 6,622,281, which pursuant to 35 U.S.C. §119(a), claims the benefit of earlier filing date and right of priority to Korean Application Nos. 28358/1999, filed Jul. 14, 1999, 48001/1999, filed on Nov. 1, 1999, 43254/1999, filed on Oct. 7, 1999 and 35023/1999, filed on Aug. 23, 1999, the contents of all of which are hereby incorporated by reference herein in their entirety.

BACKGROUND OF THE INVENTION

1. Field of the Invention

The present invention relates to the next generation mobile communications, and more particularly, to a rate matching method for the next generation mobile communication system.

2. Background of the Related Art

The ARIB of Japan, ETSI of Europe, T1 of U.S.A., TTA of Korea and TTC of Japan mapped out a more advanced next generation mobile communication system based on a radio access technique and a core network technique of the existing global system for mobile communications (GSM) that services multimedia such as sound, an image and data. The parties agreed with joint researches to present a technical specification for the advanced next generation mobile communication system, and the project was called a third generation partnership project (hereafter "3GPP").

The 3GPP is classified into several technical specification groups (TSG). In a research field for a radio access network (RAN) among the TSGs of the 3GPP, a technical specification for an uplink rate matching and a downlink rate matching is provided. The rate matching is realized by adjusting to a code rate level most appropriate to a radio interface through a puncturing process for removing a specific bit or a repetition process for adding a specific bit for a bit stream provided via a channel coding.

Algorithms used in the rate matching can be divided into puncturing algorithms and repetition algorithms. Further, different rate matching algorithms are embodied in an uplink and a downlink, which is the reason why an interleaving for a rate matched bit stream is performed in the downlink and a rate matching for an interleaved bit stream is executed in the uplink.

FIG. 1 is a block diagram showing the structure for an uplink in a conventional 3GPP standard. In the uplink, data streams of several transport blocks having the same quality of service (hereafter "QoS") have a channel coding execution according to a desired code rate, and then, are branched off into several sequences. These sequences are passed through a procedure of a 1st interleaving in a unit of a code symbol. Such 1st interleaved sequences undergo the rate matching using the puncturing algorithm or the repetition algorithm.

FIG. 2 represents a block diagram showing the structure for a downlink in the conventional 3GPP standard. In the downlink, data streams of several transport blocks having the same as 'QoS' have a channel coding execution according to a required code rate, and then, are branched off into several sequences. The sequences of the respective branches undergo rate matching using the puncturing algorithm or the repetition algorithm. Such rate matched sequences have an execution of a 1st interleaving in a unit of a code symbol.

In the channel coding applicable to the transport channel (TrCH) of the uplink or downlink there is a convolutional coding and a turbo coding. However, other specific channel coding may be applied thereto.

A multi-stage interleaver (MIL) is used as an interleaver for performing the 1st interleaving in this uplink or downlink. For reference, the span of the 1st interleaving using the MIL is same as a transmission time interval (TTL) of the TrCH.

The MIL writes a bit stream on an interleaver memory in a unit of a row, reads it in a unit of a column, and constructs an output bit stream. At this time, it is characterized that a rule based on a bit reversing order is applied in an order of reading the interleaver memory.

For example, if the number of column for the 1st interleaver is 8, each column number can be represented with 3 digits. Bit reversing for the column number can be performed in such a way that the column number bit value is reversed, namely, in such a method as '0(000)->0(000)', '1(001)->4(100)', '2(010)->2(010)', '3(011)->6(110) etc. and thereby the column bit stream based on an order of "0 4 2 6 1 5 3 7" is outputted by 1st MIL interleaver, instead of an output of the column bit stream based on an order of "0 1 2 3 4 5 6 7".

The following table 1 represents the order of the column bit stream outputted from the MIL on the basis of respective columns of the interleaver.

TABLE 1

| K | R(k) | | | | | | | |
|---|------|------|------|------|------|------|------|------|
|   | R(0) | R(1) | R(2) | R(3) | R(4) | R(5) | R(6) | R(7) |
| 2 | 0    | 1    |      |      |      |      |      |      |
| 4 | 0    | 2    | 1    | 3    |      |      |      |      |
| 8 | 0    | 4    | 2    | 6    | 1    | 5    | 3    | 7    |

Table 1 shows bit reversing when the number of columns (k) of the interleaver is 2, 4 and 8, respectively, and where R(k) indicates a result of a bit reversing.

FIG. 3 provides an order of the column bit stream outputted from the MIL in case that the column number of the interleaver, K, is 8 as shown in Table 1, in an example. Digits represented in shadow blocks of FIG. 3 indicate the order of the column bit stream actually outputted from the interleaver.

One code symbol in a turbo coder is constructed with a systematic bit, a 1st parity bit and a 2nd parity bit. The first parity bit represents output bits of an upper Recursive Systematic Convolutional Coder (RSC coder), and the second parity bit indicates output bits of a lower RSC coder. In contrast to the convolutional code, in the turbo code an importance of the three bits constructing the code symbol is different among one another.

In other words, among the systematic sequence, the 1st parity sequence and the 2nd parity sequence turbo-coded and branched off, the systematic sequence is relatively important and the remaining parity sequences decrease in importance, when decoding. Therefore, a method is needed for excluding the puncturing for the systematic sequence and puncturing mutually equally only for the remaining parity sequences, in the puncturing technique for the turbo code.

A conventional puncturing algorithm for the turbo code in the downlink is described in the following. For the turbo code in the downlink, the puncturing is generated in a unit of a code symbol, differently from the convolutional code basically generating the puncturing in a unit of a code bit.

One example out of the puncturing algorithms for the turbo code in the downlink provides that a puncturing position of the code symbol unit is decided so as to constantly perform the puncturing in the code symbol unit, and after that, the parity sequences on a corresponding code symbol position are alternately punctured. In another puncturing algorithm for the turbo code in the downlink, a position having the puncturing occurring in the code symbol unit is extended by twice distance, and after that, the parity sequences are simultaneously punctured every a code symbol in which each puncturing occurs.

Such puncturing algorithms for the turbo code are considered in the downlink. Since the puncturing procedures for the turbo code of the downlink occurs before the interleaving, the puncturing can be performed independently from the interleaving procedure.

However, if the puncturing algorithm for the turbo code are considered in the uplink, the puncturing procedure for the rate matching should be performed after the interleaving. Thus, additional terms need to be considered in comparison with the downlink.

As described above, the related art uplinks and downlinks in the 3GPP standard have various disadvantages. That is, parameters used in the puncturing procedure for the turbo code in the downlink cannot be used as is, and other and/or additional parameters should be used to satisfy a uniform puncturing of a code bit unit having a consideration for the interleaving. In other words, for a uniform amount for the respective interleaved column bit stream to be punctured, parameters are needed so that the puncturing may be uniformly generated even for the bit stream before the interleaving.

However, it is the present situation such a puncturing technique for such turbo code of the uplink is not yet considered and needed. Further, when the parameter used in the existing downlink is used in the uplink without change, even in the repetition procedure for the turbo code, a problem is caused that only a stream of a specific row is repeated. Also, it is the present situation that a rate matching method is needed that is applicable to all of a channel code such as the turbo code and the convolutional code etc. and channel codes used in the uplink and downlink.

The above references are incorporated by reference herein where appropriate for appropriate teachings of additional or alternative details, features and/or technical background.

SUMMARY OF THE INVENTION

An object of the present invention is to solve at least the above problems and/or disadvantages and to provide at least the advantages described hereinafter.

Another object of the present invention is to provide a rate matching method of a mobile communication system that substantially obviate one or more of the limitations and disadvantages of the related art.

Another object of the present invention is to provide an improved rate matching method of providing a uniform puncturing pattern and a uniform repetition pattern for each bit stream of TrCHs supplying mutually different services in the next generation mobile communication system using a Wideband Code Division Multiple Access (hereafter "W-CDMA") method.

In order to achieve at least the above-described objects of the present invention in a whole or in parts, there is provided a rate matching puncturing method in a mobile communication system that includes (a) performing a channel coding for bits of a transport channel and outputting one or more channel-coded sequences, (b) constructing a first interleaving pattern based on a unit of a symbol for each of the channel-coded sequences, (c) constructing virtual interleaving patterns for said each of the channel-coded sequences by considering a mapping rule with a corresponding first interleaving pattern, (d) calculating different bit shifting values in each column of the constructed virtual interleaving patterns and determining a bit position to be punctured, and (e) puncturing bits in each first interleaving pattern constructed in (c), based upon (d).

To further achieve at least the above-described objects of the present invention in a whole or in parts, there is provided a rate matching method for uplink in a mobile communication system that includes executing in a frame unit a turbo coding for bits of a transport channel, and branching off the bits into a systematic sequence, a first parity sequence and a second parity sequence, constructing a first interleaving pattern based on a unit of a symbol for the branched-off sequences, constructing a virtual interleaving pattern for each parity sequence turbo-coded by considering a mapping rule with a corresponding first interleaving pattern, calculating different bit shifting values in each column of each virtual interleaving pattern, deciding a bit position to be punctured in each constructed virtual interleaving pattern by using the calculated bit shifting values, and puncturing bits according to the decided bit position to be punctured.

To further achieve at least the above-described objects of the present invention in a whole or in parts, there is provided a sequence repetition method for an uplink rate matching, in a mobile communication system including performing in a frame unit a channel coding for bits of a transport channel, constructing a first interleaving pattern based on a unit of a symbol, calculating a mean repetition distance according to a prescribed bit repetition rate using a mapping rule with the constructed first interleaving pattern, computing different bit shifting values based on respective columns in the constructed first interleaving pattern by using the mean repetition distance, and deciding a repetition bit position in the constructed first interleaving pattern by using a corresponding bit shifting value.

To further achieve at least the above-described objects of the present invention in a whole or in parts, there is provided Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 3 illustrates an exemplary order of a column bit stream outputted from a MIL when the column number of an interleaver is 'K=8';

FIG. 6 sets forth an interleaving pattern of an MIL in case that the column number of a used interleaver is 'K=8';

FIGS. 7a-7b are diagrams that show an exemplary virtual interleaving pattern for two coded parity sequences;

FIGS. 8a-8f show puncturing patterns generated by another preferred embodiment of an uplink rate matching procedure according to the present invention concerning of the virtual interleaving patterns shown in FIGS. 7a-7b;

FIGS. 9a-9c are diagrams that show exemplary puncturing patterns of virtual interleavers applied to a 1st interleaving pattern;

FIGS. 10a-10c are diagrams that show puncturing patterns generated by another preferred embodiment of an uplink rate matching procedure according to the present invention of the virtual interleaving pattern shown in FIG. 7 when the quantity of puncturing per column of a 1st interleaver is an odd number;

FIGS. 11a-11c are diagrams that show puncturing patterns generated by another preferred embodiment of an uplink rate matching procedure in accordance with the present invention when a quantity of puncturing per column of a 1st interleaver is an odd number;

FIG. 12 is a diagram that shows another puncturing pattern generated by another preferred embodiment of a rate matching procedure based on an optimal level applied to a 1st interleaving pattern when a quantity of puncturing per column of a 1st interleaver is an odd number;

FIGS. 13a-13b are diagrams that show a puncturing pattern for a turbo code provided by controlling a parameter 'a' according to a preferred embodiment of the rate matching procedure based on an optimal level of the present invention;

FIGS. 14a-14b are diagrams showing puncturing patterns on a virtual interleaver through two various shifting parameter calculations when an overall puncturing more than 33.3% is generated, namely, in case a puncturing over 50% for each parity sequence is generated; and FIGS. 15a-15b are diagrams that show a repetition pattern.

DETAILED DESCRIPTION OF PREFERRED EMBODIMENTS

Initially, two decoders that are used in a system utilizing a turbo code will be described. Two decoders are positioned on both ends of an interleaver in turbo decoder, and code bits inputted to first and second decoders are respectively provided with elements of a 1st parity sequence and a 2nd parity sequence. In order to improve an overall performance of the turbo decoder, it is important that two decoders each have an equal decoding capability. In an aspect of one decoder, also, it is important in increasing or maximizing a performance of the decoder that a puncturing on an input parity sequence of the decoder occurs by a uniform interval.

Therefore, it is very important that the puncturing based on the uniform quantity should influence upon the 1st parity sequence of an upper RSC and the 2nd parity sequence of a lower RSC by considering such characteristic of the decoding procedure in a transmitting side, and the puncturing based on a uniform interval should influence upon the respective parity sequences.

Accordingly, a preferred embodiment of a puncturing method for a turbo code of an uplink according to the present invention preferably satisfies the following conditions. First, a puncturing for a systematic sequence element is excluded. Second, for parity sequence elements, the puncturing based on the uniform quantity is generated from elements of the first and second parity sequences. Third, in an overall bit column before a 1st interleaving is performed in a unit of a code symbol, a position of the puncturing on each parity sequence has a uniform interval.

In addition to these three conditions, one additional condition should be considered, namely, a specific characteristic of an uplink. Thus, a puncturing by the same quantity is generated for all radio frames passed through the interleaving. That is, a uniform code bit for respective interleaved column bit streams is punctured.

In the preferred embodiments according to present invention, puncturing the turbo code provided in the uplink satisfies the above conditions.

Preferred embodiments of the puncturing procedure for a turbo code rate matching of an uplink will now be described in accordance with the present invention. For convenience, a case that the number of columns, K, in an interleaver is '8' will now be described. The present invention is, of course, not intended to be so limited and is applicable to other cases such as when the number of columns, K, in the interleaver is 1, 2, 4.

Figure 1:
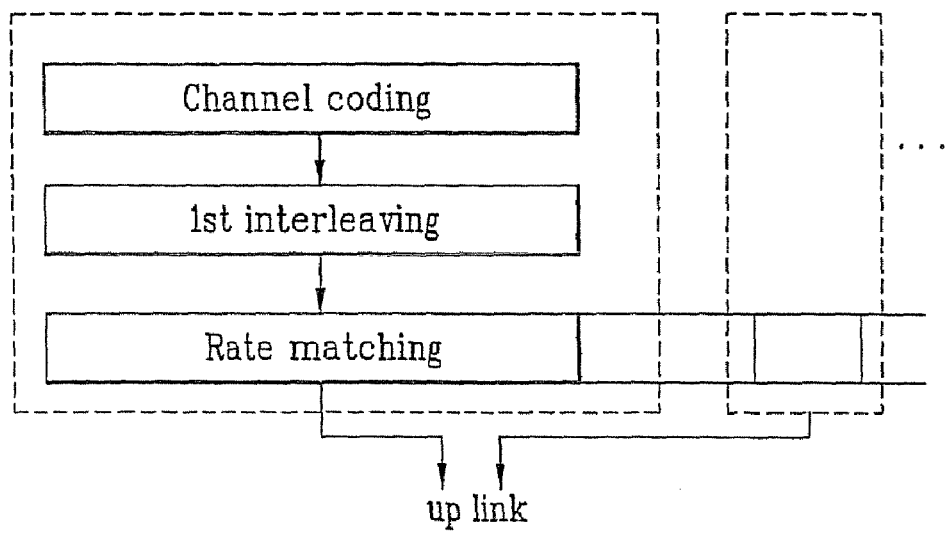
FIG. 1 represents a block diagram showing a portion of structure for a related art transport channel multiplexing an uplink according to a 3GPP standard.
Figure 2:
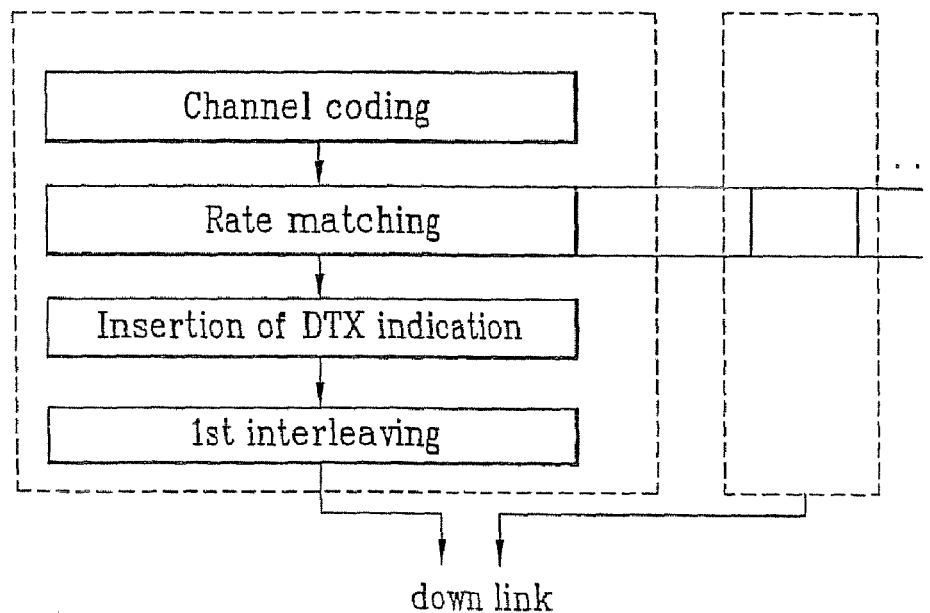
FIG. 2 represents a block diagram showing a portion of structure for a related art transport channel multiplexing a downlink according to a 3GPP standard.
Figure 4:
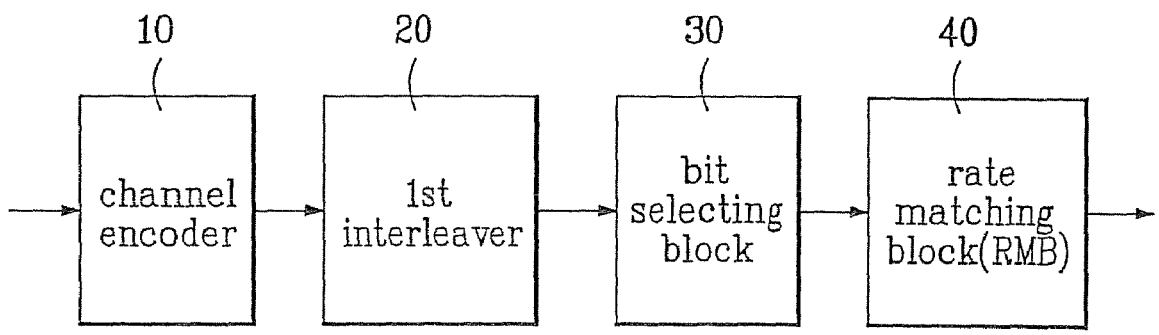
FIG. 4 is a block diagram showing a preferred embodiment of an uplink rate matching procedure in accordance with the present invention.
Figure 5:
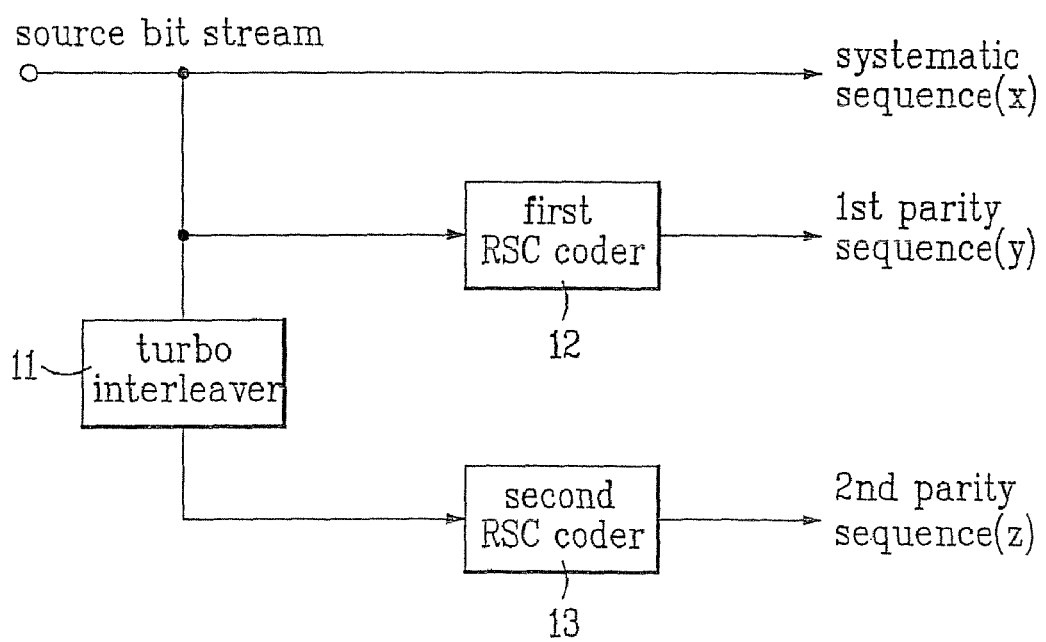
FIG. 5 depicts a block diagram providing construction of an exemplary channel encoder of FIG. 4.

FIG. 4 sets forth a block diagram showing a first preferred embodiment of an uplink rate matching procedure based on an optimal level in accordance with the present invention. FIG. 5 provides a block diagram showing additional detail of a channel encoder that can be used in FIG. 4.

In a case of ⅓ rate turbo coding, x is an output of a channel encoder 10 is a systematic sequence, y is a 1st parity sequence, and z is a 2nd parity sequence generated in the lower RSC encoder through an input of a turbo-interleaved systematic sequence. These branched-off sequences are provided as outputs in the turbo coding result for the TrCH, and are then passed through the 1st interleaving, where the 1st interleaving is preferably performed for one sequence obtained by multiplexing the branched-off sequences.

Two parity sequences y,z among the turbo-coded outputs are outputs of respective RSC coders 12,13.

In particular, each independent virtual interleaving pattern is constructed for a 1st parity sequence (y) element and a 2nd parity sequence (z) element among three sequences passed through the 1st interleaving. Preferably, the construction is performed in a bit selection block 30. A rate matching block (RMB) 40 can separately apply the same puncturing process or algorithm to two individual virtual interleaving patterns constructed in the bit selection block 30.

FIG. 6 indicates an interleaving pattern of a 1st interleaver 20 when the column number, K, of the interleaver used in the first preferred embodiment is 8, and FIGS. 7a-7b depict virtual interleaving patterns for two coded parity sequences. In particular, FIG. 7a shows a virtual interleaving pattern for the 1st parity sequence element, and FIG. 7b presents a virtual interleaving pattern for the 2nd parity sequence element.

In FIG. 7, digits provided on the upper shadow portions represent column numbers on an original 1st interleaver of FIG. 6. In other words, it shows a relation between column numbers on the virtual interleaver and column numbers on the actual 1st interleaver.

The rate matching block (RMB) 40 in the first preferred embodiment of a puncturing process for a turbo code of an uplink basically uses the following two procedures so that the puncturing based on each uniform quantity in two virtual interleavers with such construction may be generated by a uniform interval on a sequence before the virtual interleaving. First, shifting parameters per column of each virtual interleaving pattern are calculated. Second, the first calculated shifting parameter per column is applied to an actual puncturing algorithm for an original interleaving pattern. That is, the shifting parameters per each column of the virtual interleaving pattern are computed, and this is mapped to the shifting parameter for each column of the 1st interleaving pattern.

The RMB 40 is used in a process in which the puncturing is performed by the P number of bits every individual column sequence having a bit length of $N_C$ in the 1st interleaving pattern shown in FIG. 6. Thus, for the 1st parity sequence element having a bit length of an $N_C/3$ in every respective column, the puncturing is performed by the P/2 number of bits. For the 2nd parity sequence element having the bit length of the $N_C/3$ in every respective column, the puncturing is also performed by the P/2 number of bits.

At this time, as described above, the RMB 40 separately applies the same puncturing process to two respective virtual interleaving patterns constructed in the bit selection block 30, namely, to the respective parity sequence elements. For that, first, an initial error offset value $e_{ini}$ should be gained for each column of the 1st interleaver 20. In order to gain the initial error offset value $e_{ini}$, the shifting parameter to be applied to each column of an interleaver memory should be calculated respectively by a first parameter determination method or algorithm and a second parameter determination method or algorithm.

The first parameter determination algorithm and the second parameter determination algorithm for calculating shifting parameters S1,S2 to be used in the puncturing algorithm for the first and second parity sequence elements will now be described.

In the first parameter determination process for computing the shifting parameter S1 for the first parity sequence element, when each column in the 1st interleaver is constructed by the bit length of $N_C$ as shown in FIG. 6 and the puncturing by the P number of bits is performed in every respective column, the following preconditions are required. In the following described procedures, it is first assumed for an explanatory convenience that P has only a value of an even number. A generation for a P value of an odd number will be described later.

First, a number of code symbol $N=\lfloor N_C/3 \rfloor$: herewith, a character $\lfloor x \rfloor$ indicates the maximum integer value that is not over x, which means a cut-off under a decimal point of x. N is not an actual code symbol but is regarded as the code symbol.

Second, the number of code symbols after the puncturing, $$N_i = N - P/2 \qquad (1)$$

Third, $q=\lfloor N/|N_i-N| \rfloor$; wherein q represents an average puncturing distance of the code symbol unit.

When q is calculated in the above preconditions, the first parameter determination algorithm for calculating the shifting parameter S1 applicable to each column from the calculated q value is represented as follows.

```
"if(q≦2) {
    for(k=0; k < K; k++) {
        if((k mod 2)==0)
            S₁[R[(3k+1)mod K]] = 0 ;
        else
            S₁[R[(3k+1)mod K]] = 1 ;
    } }
    else {
        if(q is even)
```

-continued $$q' = q - \frac{GCD(q, K)}{K}$$

```
        else q' = q
    for(i=0; i<K; i++) {
        k = ⌈i*q'⌉mod K    ;
        S₁[R[(3k + 1)mod K]] =⌈i*q'⌉divK;   }  } "
```

In the above first parameter determination algorithm, $$\text{``} q' = q - \frac{GCD(q, K)}{K} \text{''}$$

is provided to prevent a consecutive puncturing in the same column, wherein "GCD(q,K)" indicates the greatest common divisor, and "R[(3k+1)mod K]" is the expression provided by considering a mapping from the virtual interleaving pattern to the actual first interleaver and a relation between the respective columns of the first interleaver and an order of radio frames.

"$S_1[R[(3k+1) \mod K]]=\lceil i*q' \rceil$ div K" is the expression provided to compute the shifting parameter S1 per radio frame resultantly, where a character $\lceil x \rceil$ indicates the minimum integer value that is more than x.

In the second parameter determination process for computing the shifting parameter S2 for the second parity sequence element, when each column of the 1st interleaver is constructed by the bit length of $N_C$ as shown in FIG. 6 and the puncturing by the P number of bits is performed every respective column, the following preconditions are preferably required.

First, a code symbol $N=\lfloor N_C/3 \rfloor$: herewith, $\lfloor x \rfloor$ is the maximum integer value which is not over x, which means a cut-off under a decimal point of x, and N is not an actual code symbol but is regarded as the code symbol.

Second, the number of code symbols after the puncturing is, $$N_i = N - P/2 \qquad (2)$$

Third, $q=\lfloor N/|N_i-N| \rfloor$; wherein q represents an average puncturing distance of the code symbol unit.

When q is calculated in the above preconditions, the second parameter determination algorithm for calculating the shifting parameter S2 applicable to each column from the calculated q value is represented as follows.

```
"if(q≦2) {
    for(k=0; k < K; k++) {
        if((k mod 2)==0)
            S₂[R[(3k+2)mod K]] = 0 ;
        else
            S₂[R[(3k+2)mod K]] = 1 ;
    } }
    else {
        if(q is even)
```

$$q' = q - \frac{GCD(q, K)}{K}$$

```
        else q' = q
    for(i=0; i<K; i++) {
        k = ⌈i*q'⌉mod K    ;
        S₂[R[(3k + 2)mod K]] =⌈i*q'⌉divK;   }  } "
```

In the above second parameter determination algorithm, $$"q' = q - \frac{GCD(q, K)}{K}"$$

is provided to prevent a consecutive puncturing in the same column, wherein "GCD(q,K)" indicates the greatest common divisor, and "R[(3k+2)mod K]" is the expression provided by considering a mapping from the virtual interleaving pattern to the first actual interleaver and a spatial relation between the respective columns of the first interleaves and an order of radio frames.

"$S_2[R[(3k+2) \mod K]] = \lceil i*q' \rceil \text{div} K$" is the expression provided to compute the shifting parameter S2 per radio frame resultantly, wherein the character $\lceil x \rceil$ indicates the minimum integer value more than x.

The shifting parameters S1,S2 are calculated for each column by such above parameter determination algorithms. Then, the following rate matching process or algorithm for the puncturing is performed by using the initial error offset value $e_{ini}$ gained therefrom.

A computation procedure of the initial error offset value $e_{ini}$ for the first parity sequence element and a computation procedure of the initial error offset value $e_{ini}$ for the second parity sequence element are applied separately to the rate matching puncturing algorithm. According to preferred embodiments of the present invention, the following rate matching puncturing algorithm preferably requires following basic preconditions.

First, $N_C$: number of data bits in each column of the 1st interleaver. Second, P=maximum amount of puncturing allowed per each column in the 1st interleaver.

Third, $N = \lfloor N_C/3 \rfloor$: determines the number of bits for each parity bit sequence and determines number of executions in the following loop. Fourth, the number of code symbols after the puncturing: $N_i$ (1st parity sequence: the expression (1), 2nd parity sequence: the expression (2)). Fifth, k is the radio frame numbers of the first interleaver, {k=0, 1, 2, 3, ..., K−1}, wherein K is the number of columns in the first interleaver.

---

"if the puncturing is to be performed
   y = (N − $N_i$)     ; the number of puncturing bits
      $e_{ini}$ = (a*$S_j$(k)*y+N) mod (a*N) ; where j is 1 for the 1st parity sequence and 2 for the 2nd parity sequence.
     if($e_{ini}$=0)
       $e_{ini}$ = a*N
     e = $e_{ini}$
     m = 1     ; index of current bit
     do while m <= N
       e = e − a*y   ; update error
       if e <= 0 then ;check if bit number m should be punctured
          puncture m-th bit from each parity sequence
          e = e+ a*N  ; update error
       end if
       m = m + 1   ; index of next bit
     end do"

---

Such above procedure is called as a pattern determination algorithm of the rate matching. Several puncturing patterns according to preferred embodiments can be obtained by providing differing values of 'a' in the pattern determination algorithm. For example, in a case of a convolutional code, 2 is used as 'a' value. But, in a case of the turbo code, mutually different 'a' values for the first and second parity sequences can be used. In other words, 'a=2' can be used for the first parity sequence and 'a=1' can be used for the second parity sequence. Alternatively, 'a=1' can be used for the first parity sequence and 'a=2' can be used for the second parity sequence. Also, 'a=2' may be used for both the first and second parity sequences.

FIGS. 8a-8f are diagrams that show puncturing patterns generated by the first preferred embodiment of the inventive uplink rate matching procedure, concerning of the virtual interleaving pattern shown in FIGS. 7a-7b. However, the present invention is not intended to be so limited. FIG. 8a shows the puncturing pattern of the virtual interleaver for the first parity sequence (y) element, and FIG. 8b shows the puncturing pattern of the virtual interleaver for the second parity sequence (z) element. In this example, it is supposed that an application to all of the first and second parity sequences is possible by fixing the 'a' value as 2.

FIG. 8c is a diagram that represents the puncturing pattern on the virtual interleaver of the first parity sequence in case that the 'a' value is as '1'. FIG. 8d is a diagram that represents the puncturing pattern on the virtual interleaver of the second parity sequence in case that the 'a' value is as '2'. FIG. 8e is a diagram that provides the puncturing pattern on the virtual interleaver of the second parity sequence in case that the 'a' value is as '2'. FIG. 8f is a diagram that shows the puncturing pattern on the virtual interleaver of the second parity sequence in case that the 'a' value is as '1'.

FIGS. 9a-9c are diagrams that show an overall puncturing pattern in case that the puncturing pattern of each virtual interleaver shown in FIGS. 8a-8f is actually applied to the first interleaving pattern. FIG. 9a shows the puncturing pattern of a case of fixing the 'a' value as '2' and using it for the first and second parity sequences. FIG. 9b is for the puncturing pattern of a case of using the 'a' value as each of 1 and 2 for the first and second parity sequences. FIG. 9c is the puncturing pattern for a case that the 'a' value is used as each of 2 and 1 for the first and second parity sequences.

FIGS. 9a-9c provide a case that the first interleaved whole bit number is 288 and 32 bits among them are punctured. In the above preferred embodiments of the rate matching algorithm, 4 bits based on each column of the first interleaving pattern are punctured. That is, 4 bits among 32 bits (288/8) of each column are punctured.

In comparing such case with the virtual interleaving pattern for each parity sequence elements as shown in FIGS. 7a-7b, respectively, two bits per each column are each punctured in each virtual interleaving pattern. In other words, 2 bits among 12 bits (96/8) of each column are punctured.

The inventive rate matching puncturing procedure for the turbo code of the uplink according to the first preferred embodiment, which was described above, is preferably for the case that the puncturing occurs so that a target code rate may become under ½, and is also for the case that the puncturing bit number is an even number bit for each column of the first interleaver. However, the present invention is not intended to be so limited. For example, an odd number bit can be punctured per each column for the first interleaved overall bit column. Accordingly, a preferred embodiment of a procedure for puncturing based on an optimal level will now be described for cases that the target code rate is under ½ and the puncturing bit number is the odd number bit in each column of the first interleaving pattern. FIGS. 10a-10c provide puncturing patterns generated by uplink rate matching procedure concerning of the virtual interleaving pattern shown in FIGS. 7a-7b in case that the quantity of puncturing per column of a 1st interleaver is an odd number. Different from in FIGS. 9a-9c where an even number bit is punctured for each column of the first interleaving pattern, FIG. 10 shows the case that the odd number bit is punctured for each column of the first interleaved pattern.

Further in FIGS. 9a-9c, 32 bits for the first interleaved overall bit column are punctured. Namely, 4 bits per each column are punctured.

However, 24 bits for the first interleaved overall bit column are punctured in the preferred embodiment shown in FIGS. 10a-10c. Namely, 3 bits per each column should be punctured.

Therefore, if performed using the above-described parameter determination algorithm, 1.5 bits should be punctured for each of the first and second parity sequence elements. But, since that is actually impossible, complementary methods will now be described.

Solving such problems will now be described using three methods according to preferred embodiments of the present invention. In a first method, in case three bits for each column of the first interleaving pattern should be punctured, it is the method of puncturing two bits by $\lceil 1.5 \rceil = 2$ on the first parity sequence and also puncturing one bit by $\lfloor 1.5 \rfloor = 1$ on the second parity sequence. In this case, the above-mentioned expressions (1) and (2) should be preferably generalized as follows.

$N_i = N - \lceil P/2 \rceil$ (1'); 1st parity sequence, and
$N_i = N - \lfloor P/2 \rfloor$ (2'); 2nd parity sequence.

In a second method, it is the method of embodying the parameter determination algorithm so that one bit is punctured by $\lfloor 1.5 \rfloor = 1$ on the first parity sequence and two bits are punctured by $\lceil 1.5 \rceil = 2$ on the second parity sequence. In this case, the above-described expressions (1) and (2) should be generalized as follows.

$N_i = N - \lfloor P/2 \rfloor$ (1''); 1st parity sequence, and
$N_i = N - \lceil P/2 \rceil$ (2''); 2nd parity sequence.

In other words, in embodying the parameter determination algorithm, for the remaining first and second parity sequences excepting of the systematic sequence among sequences outputted after the turbo coding, in case a pre-decided puncturing bit number is P, the $\lceil P/2 \rceil$ number of bits are punctured for the first parity sequence and the $\lfloor P/2 \rfloor$ number of bits are punctured for the second parity sequence. Alternatively, the $\lfloor P/2 \rfloor$ number of bits are punctured for the first parity sequence and the $\lceil P/2 \rceil$ number of bits are punctured for the second parity sequence.

However, problems can occur when the shifting parameter is calculated and the puncturing is performed by such method. That is, in case that the quantity of puncturing, P, is an odd number, if the $\lfloor P/2 \rfloor$ number of puncturing is performed on the first parity sequence and the $\lceil P/2 \rceil$ number of puncturing is performed on the second parity sequence, there exists a difference caused in the puncturing number by the number of columns of the first interleaver in an overall aspect. In other words, if the number of columns of the first interleaver is K, the overall puncturing quantity of the 1st parity sequence becomes a smaller quantity by K at maximum in comparison with the puncturing quantity of the 2nd parity sequence. That is, the puncturing on the first and second sequences each has a uniform puncturing interval, but its puncturing interval becomes mutually different on the 1st and 2nd parity sequences. In this example, the puncturing interval on the first parity sequence has a larger value in comparison with the puncturing interval on the second parity sequence. However, the difference of the puncturing quantity by K at maximum does not significantly influence the whole performance of the turbo decoder.

FIGS. 10a-10b show resultant puncturing patterns when the number of punctures P is 3 for cases that the $\lfloor P/2 \rfloor = 1$ number of puncturing is performed on the first parity sequence and the $\lceil P/2 \rceil = 2$ number of punctures are performed on the second parity sequence. Herewith, it is assumed that the 'a' value is applied as 2 for all of the first and second parity sequences. FIG. 10a shows the puncturing pattern on the virtual interleaver for the 1st parity sequence, and FIG. 10b shows the puncturing pattern on the virtual interleaver for the 2nd parity sequence. FIG. 10c provides a resultant puncturing pattern on the 1st interleaver.

FIGS. 11a-11b provide the resultant puncturing pattern when the number of punctures P is 3 for cases that the $\lceil P/2 \rceil = 2$ number of punctures are performed on the first parity sequence and the $\lfloor P/2 \rfloor = 1$ number of puncturing is performed on the second parity sequence. FIG. 11a shows the puncturing pattern on the virtual interleaver for the 1st parity sequence, and FIG. 11b shows the puncturing pattern on the virtual interleaver for the 2nd parity sequence. FIG. 11c indicates a resultant puncturing pattern on the 1st interleaver.

In the third method, when the quantity of punctures per column is P, a bit shifting value on the virtual interleaver is calculated through the puncturing quantity of $\lceil P/2 \rceil$. An initial error offset $e_{ini}$ of each RMB is computed by using such calculated bit shifting value S1 and S2. In each RMB, the rate matching puncturing is performed by using this computed $e_{ini}$ value so as to generate the puncturing of $\lceil P/2 \rceil$. In this case, the above-described expressions (1) and (2) can be expressed as follows.

$N_i = N - \lceil P/2 \rceil$ (1'''); 1st parity sequence, and
$N_i = N - \lceil P/2 \rceil$ (2'''); 2nd parity sequence.

After that, the rate matching pattern determination algorithm is executed so that the puncturing of a partial bit, which is 1 bit in this case, is excluded for the 1st or 2nd parity sequence. The quantity of such executed overall puncturing should be P*K. In order to satisfy such requirements, several methods can be used. Describing an initial method, the puncturing for one bit on the first parity sequence is excluded, for columns in an order of the even number of the 1st interleaver. Meantime, in columns based on the order of an odd number, the puncturing for one bit on the second parity sequence is excluded. When such procedures are repeated, on the even numbered columns of the interleaver, the puncturing is increased by 1 bit on the second parity sequence relative to the 1st parity sequence. On the odd numbered columns, the puncturing is more by 1 bit on the first parity sequence relative to the second parity sequence. Further, an opposite method to this can be considered according to the present invention. However, a new logic for excluding the 1 bit puncturing per each interleaver column is needed. One method for this logic according to the preferred embodiments is to provide a puncturing position to be excluded (e.g., as a final puncturing position) when the puncturing per each column is performed on each parity sequence.

In an execution another preferred embodiment of the rate matching algorithm for the K/2 number of columns before the 1st interleaving pattern, a final puncturing on the 1st parity sequence is excluded, and for the post K/2 number of columns, a final puncturing on the 2nd parity sequence is excluded. Again, the opposite case can also be used.

FIG. 12 is a diagram that shows the puncturing pattern for a case of using the above described third method, in performing the puncturing of 3 bits per each column. That is, the method is used for that the puncturing pattern of each virtual interleaver is gained by $\lceil P/2 \rceil = 2$, after that, in an actual puncturing procedure the final puncturing of the 1st parity sequence is excluded in the even numbered columns and the final puncturing of the 2nd parity sequence is excluded in the odd numbered columns.

In the above-described third method, the puncturing quantity on each parity sequence preferably always has an equal value with each other, regardless of that the puncturing number P per each column of the 1st interleaver is the odd number or the even number. But this method can have a shortcoming. Thus, an additional logic is needed for excluding the final puncturing of any parity sequence per column. Another shortcoming is the puncturing requirement for a uniform interval on each parity sequence is not satisfied. That is, since the final puncturing is excluded according to a case of each column, it can be noted that a uniformity in the puncturing interval is upset in an aspect of the sequence before an original interleaving, as shown in FIG. 12.

The above-mentioned three methods can settle a problem caused when the puncturing number P per each column of the 1st interleaver is an odd number. Three methods all have the respective advantages, merits can have shortcomings. But one of the above first and second methods may be more preferable, considering a complication caused by an addition of a logic and a trade-off between performance.

In addition, the preferred embodiments were described above centering on the uniform puncturing for the turbo code. However, the present invention is not intended to be so limited.

The above-described parameter determination process and the rate matching puncturing process are applicable even to a case that the channel encoder performs the convolutional coding. For example, according to another preferred embodiment of the inventive rate matching procedure, the puncturing algorithm for the convolutional code of the existing bit unit is used as it is, and also, the puncturing position based on a uniform interval on each parity sequence can be designated. Therefore, the uniform puncturing for the turbo code of the uplink is realized.

A procedure for deciding an optimal parameter so as to get the uniform puncturing pattern for a channel code such as the turbo code and the convolutional code etc. on the basis of the above-described preferred embodiments of the rate matching puncturing algorithm will now be described. Further, preferred embodiments of a rate matching puncturing procedure applicable to all of the channel code used in the uplink and the channel code used in the downlink will now be described.

Before additional inventive detailed description, the RMB in FIG. 4 performs that algorithm by applying several sequences branched off, to the following rate matching algorithm, according to a target code rate. The RMB can use several parameters. The parameters used according to the target code rate include a parameter representing the number of bits for each branched off input sequence, a parameter indicating a bit quantity punctured on each branched off bit stream passed through a channel coding and a parameter used in adjusting a pattern of the puncturing, for example.

If the RMB has an input of the turbo-coded sequences, the puncturing for the systematic sequence is excluded. Thus, a parameter value representing the puncturing bit quantity becomes '0', and the parameter value indicating the puncturing bit quantity for the first and second parity sequences becomes respectively $\lceil P/2 \rceil$ or $\lfloor P/2 \rfloor$.

In the above-described preferred embodiments of rate matching algorithm for the turbo code of the uplink, parameters as shown in table 2 can be used to get the uniform puncturing pattern or a uniform repetition pattern. As shown in table 2, an available combination totals six. In other words, it is available to gain six mutually different puncturing patterns by changing the 'a' values and the puncturing quantity for the individual parity sequence.

TABLE 2

|   | systematic sequence (x) | 1st parity sequence (y) | 2nd parity sequence (z) |
|---|---|---|---|
| a | 2 | 2 | 2 |
|   | 2 | 1 | 2 |
|   | 2 | 1 | 1 |
| number of puncturing bits | 0 | $\lceil P/2 \rceil$ or $\lfloor P/2 \rfloor$ | $\lceil P/2 \rceil$ or $\lfloor P/2 \rfloor$ |
| sequence length | $\lfloor N_c/3 \rfloor$ | $\lfloor N_c/3 \rfloor$ | $\lfloor N_c/3 \rfloor$ |

Even though any one out of the above six combinations is used in the uplink, there is not a large difference in an overall performance of the turbo decoder. But, the preferred embodiments of the rate matching puncturing process can be applied not only to the uplink but also to the downlink by properly controlling the parameter 'a' for adjusting the punctured bit position and also is applicable to the convolutional code. For that, preferred embodiments of a RMB can preferably use parameters represented in the following tables 3, 4 and 5.

TABLE 3

|   | systematic sequence (x) | 1st parity sequence (y) | 2nd parity sequence (z) |
|---|---|---|---|
| a | 2 | 1 | 2 |
| number of puncturing bits | 0 | $\lfloor P/2 \rfloor$ | $\lceil P/2 \rceil$ |
| sequence length | $\lfloor N_c/3 \rfloor$ | $\lfloor N_c/3 \rfloor$ | $\lfloor N_c/3 \rfloor$ |

Table 3 shows parameters preferably used in an inventive RB for the turbo code according to the present invention. In an example, in case that 'a' is fixed as 2 on all two parity sequences and then it is applied to the rate matching algorithm, a deduction by 2*y from the initial error offset value $e_{ini}$ is consecutively performed. Then, a corresponding bit is punctured when its updated error value satisfies a condition of "$e \leq 0$". After the puncturing, 2*N is added to a final updated error value and the algorithm can preferably operate continuously to determine a bit to be next punctured.

However, when applying parameters of table 3, a bit position initially punctured on the first parity sequence is increased by about twice. If a mean puncturing distance is represented in an integer number, it is increased exactly by twice, which is shown in FIG. 11.

FIG. 13a depicts the puncturing patterns for the turbo code in case that the parameter 'a' used in the inventive optimal rate matching puncturing procedure is used as 2 in all two parity sequences. FIG. 13b illustrates the puncturing patterns for the turbo code in case that the parameter 'a' used in the inventive optimal rate matching procedure is used as 1 for the 1st parity sequence and is used 2 for the 2nd parity sequence.

As known in FIGS. 13a and 13b, the parameter 'a' for adjusting the puncturing bit position has an application of 1 for the 1st parity sequence and has an application of 2 for the 2nd parity sequence. Therefore, the uniform puncturing for the 1st and 2nd parity sequences is ensured through the same puncturing algorithm. Of course, the uniform puncturing is satisfied even for the whole parity sequence pair, which is a ½ rate puncturing pattern that is known as Berrou. That is to say, when the parameters shown in table 3 is used, the puncturing pattern of Berrou can be embodied through the rate matching puncturing procedure.

Tables 4 and 5 show parameters usable in the RMB for the convolutional code.

TABLE 4

|   | $557_8$ sequence (x) | $663_8$ sequence (y) | $711_8$ sequence (z) |
|---|---|---|---|
| a | 2 | 1 | 2 |
| number of puncturing bits | P | 0 | 0 |
| sequence length | $\lfloor N_c/3 \rfloor$ | $\lfloor N_c/3 \rfloor$ | $\lfloor N_c/3 \rfloor$ |

TABLE 5

|   | $557_8$ sequence (x) | $663_8$ sequence (y) | $711_8$ sequence (z) |
|---|---|---|---|
| a | 2 | 1 | 2 |
| number of puncturing bits | $\lfloor P/2 \rfloor$ | $\lfloor P/2 \rfloor$ | 0 |
| sequence length | $\lfloor N_c/3 \rfloor$ | $\lfloor N_c/3 \rfloor$ | $\lfloor N_c/3 \rfloor$ |

For ⅓ rate convolutional code being currently used in 3GPP standard, a channel encoder uses "$557_8=101101111_2$", "$663_8=110110011_2$", and "$711_8=111001001_2$" polynomials.

Preferably, the sequence outputted by the "$557_8=101101111_2$" polynomial is 'x', the sequence outputted by "$663_8=110110011_2$" polynomial is 'y', and the sequence outputted by "$711_8=111001001_2$" polynomial is 'z'. In a preferred embodiment of a rate matching algorithm for the convolutional code, uniform puncturing for the channel-coded overall bit stream is performed. This is based on the condition that all the respective output sequences have the same importance in a case of executing the convolutional coding. In contrast, the systematic sequence among the output sequences of the channel encoder has a higher importance in comparison with the first and second parity sequences when the channel encoder performs the turbo coding.

However, even when the channel encoder actually performs the convolutional coding, each output sequence has different influences upon an overall hamming weight. Consequently, in order for a more efficient performance, it is preferably necessary to exclude a puncturing for a specific sequence having higher importance among the convolutionally coded output sequences.

Currently, it is desirable to exclude the puncturing for the sequence 'z' outputted by "$711_8=111001001_2$" polynomial among the three output sequences x,y,z coded convolutionally. Accordingly, in preferred embodiments of the present invention, the parameters of table 4 are used so as to perform the puncturing only for the sequence 'x' outputted by "$557_8=101101111_2$" polynomial. In another inventive example, the parameters of Table 5 are used so as to execute alternately the punctures for the sequence 'x' outputted by "$557_8=101101111_2$" polynomial and the sequence 'y' outputted by "$663_8=110110011_2$" polynomial.

Parameters shown in the tables 6 and 7 can be used selectively according to the present invention when the channel encoder performs the convolutional coding.

TABLE 6

|   | $557_8$ sequence (x) | $663_8$ sequence (y) | $711_8$ sequence (z) |
|---|---|---|---|
| a | 2 | 2 | 1 |
| number of puncturing bits | P | 0 | 0 |
| sequence length | $\lfloor N_c/3 \rfloor$ | $\lfloor N_c/3 \rfloor$ | $\lfloor N_c/3 \rfloor$ |

TABLE 7

|   | $557_8$ sequence (x) | $663_8$ sequence (y) | $711_8$ sequence (z) |
|---|---|---|---|
| a | 2 | 2 | 1 |
| number of puncturing bits | $\lfloor P/2 \rfloor$ | $\lfloor P/2 \rfloor$ | 0 |
| sequence length | $\lfloor N_c/3 \rfloor$ | $\lfloor N_c/3 \rfloor$ | $\lfloor N_c/3 \rfloor$ |

Thus, the same rate matching puncturing algorithm can be used in the uplink and downlink by controlling and using the parameters in the preferred embodiments of the inventive rate matching puncturing procedure. Further, the same rate matching puncturing algorithm can be used for the turbo and convolutional code. In particular, a specific logic is not needed for excluding of the puncturing when applying the parameters above.

As described above, the preferred embodiment of a method of constructing the parameters was described to gain the uniform puncturing pattern in the uplink. In the above procedure, the puncturing for the overall bit column operates until 33.3% without any difficulty. If a puncturing over 33.3% occurs such as when the target coding rate to be obtained through the rate matching puncturing is more than ½, the puncturing for each parity sequence is generated over 50% respectively. A mean puncturing distance q based on the code symbol unit for each parity sequence is gotten by "$q=\lfloor N/|N_i-N| \rfloor$", and thus a value less than 2 is obtained.

As described hereafter, $\Delta N$ is defined as the amount of rate matching. If the number of input bit to the rate matching block is N and $\Delta N$ amount of rate matching is performed in the rate matching block, the resultant output from RMB has a length of $N+\Delta N$. In the above, $N_i$ can be represented as $N+\Delta N$. Therefore, if $\Delta N$ has a negative sign, then it means $|\Delta N|$ amount of puncturing should be imposed in the RMB. Otherwise, $\Delta N$ amount of repetition should be imposed in the RMB. Accordingly, $\Delta N$ is now a signed value.

When q has a value less than 2, it is determined in the related art that the shifting parameter value for each radio frame alternately has 0 and 1. Further, in the base process of the preferred embodiments, the puncturing operates well only in a case that a ratio between N and $|\Delta N|$ is near 2. The smaller its ratio is from 2, the less the uniformity of the puncturing patterns becomes. That is, though the uniform puncturing for each column is generated, the uniform puncturing condition for the sequence before virtual interleaving is not satisfied.

In an inventive example according to the preferred embodiments, when the puncturing rate for an overall bit column is over 33.3% in the rate matching procedure, namely, in case that the puncturing over 50% each influences upon two parity sequences, the shifting value is calculated by exchanging a concept for a bit position having a generation of the puncturing and a bit position not having a generation of the puncturing to gain more uniform puncturing pattern. In particular, the number of bits not having a generation of the puncturing is applied to a calculation of the shifting parameters.

In preferred embodiments when puncturing over 50% should influence upon each parity sequence, a new parameter R is defined by a modified modulo operation so that more uniform puncturing may be generated, and a range of the puncturing is preferably computed by using this parameter R. Here, modulo operation on negative value is defined in a circular manner, which means, $\Delta N \bmod N \equiv N - |\Delta N|$, if $\Delta N$ is negative.

According to the present invention, in cases that the puncturing over 50% is generated and the puncturing under 500% is generated, respectively, for two parity sequences, each parameter q that represents a mean puncturing distance of the code symbol unit is computed differently from each other. Finally, the shifting parameters are calculated by the mutual differently computed 'q' according to the puncturing rate and it is used for the rate matching puncturing algorithm.

In the above generalized rate matching algorithm, the parameter q indicating the average puncturing distance of the code symbol unit q has a positive (+) value in case that the puncturing over 50% each for the first and second parity sequences is performed. Meantime, q has a negative (−) value in case the puncturing each under 50% for two parity sequences. Thereby, it is used to compute the shifting parameters for each parity sequence.

Another parameter determination process of the preferred embodiments according to the present invention for computing the shifting parameters for the 1st parity sequence provided at this time will now be described.

$N = \lfloor N_C/3 \rfloor$; each sequence size for puncturing.

$\Delta N_i = \lfloor \Delta N/2 \rfloor$; bit quantity to be punctured for 1st parity sequence where $|\Delta N|$ means the amount of puncturing for each column in 1st interleaver.

"$R = \Delta N_i \bmod N = N - |\Delta N_i|$;
if$((R \neq 0)\&(2*R \leq N))$
   $q = \lceil N/R \rceil$
else
   $q = \lceil N/(R-N) \rceil$
endif
if q is even then $q' = q + \dfrac{GCD(|q|, K)}{K}$ else
   $q' = q$
endif
for(i=0;i<K;i++)
   $k = |\lfloor i* q' \rfloor| \bmod K$
      $S_1[R[(3k+1) \bmod K]] = |\lfloor i* q' \rfloor| div K$
endfor"

A similar procedure is preferably applied to the 2nd parity sequence to calculate the shifting parameter $S_2$ for 2nd parity sequence.

$N = \lfloor N_C/3 \rfloor$; each sequence size for puncturing $\Delta N_i = \lceil \Delta N/2 \rceil$; bit quantity to be punctured for 2nd parity sequence where $|\Delta N|$ means the amount of puncturing for each column in the 1st interleaver.

"$R = \Delta N_i \bmod N = N - |\Delta N_i|$;
if$((R \neq 0)\&(2*R \leq N))$
   $q = \lceil N/R \rceil$
else
   $q = \lceil N/(R-N) \rceil$
endif
if q is even then $q' = q + \dfrac{GCD(|q|, K)}{K}$ else
   $q' = q$
endif
for(i=0;i<K;i++)
   $k = |\lfloor i* q' \rfloor| \bmod K$
      $S_2[R[(3k+2) \bmod K]] = |\lfloor i* q' \rfloor| div K$
endfor"

In two parameter determination algorithms above, $$"q' = q + \frac{GCD(|q|, K)}{K}"$$

is provided to prevent the puncturing from being continued in the same column, and "$k=|\lfloor i*q' \rfloor| \bmod K$" indicates a column number on the virtual interleaver. Also, "$S_1[R[(3k+1) \bmod K]]=|\lfloor i*q' \rfloor| div K$" is the expression showing the procedure of conceptualizing the shifting parameter per each column of the virtual interleaver for the first parity sequence in due order of actual radio frames, and "$S_2[R[(3k+2) \bmod K]]=|\lfloor i*q' \rfloor| div K$" is the expression representing the procedure of conceptualizing the shifting parameter per each column of the virtual interleaver for the second parity sequence in due order of actual radio frames.

In the above-described procedure, "if$((R \neq 0)\&(2*R \leq N))$" corresponds to a case of the puncturing rate over 50%. That is, considering the case the puncturing occurs over 50%, it is calculated by "$R=N-|\Delta N_i|$" as described above. Consequently, when the q value is computed by using the R value, it can be noted that the number of bits not having an occurrence of the puncturing is represented among a length of an overall bit column for virtual interleaver, N, inputted to the rate matching block. In an opposite case, since "$R-N=-|\Delta N_i|$" is used in the calculation of the q value, it can be noted that the q value is computed by the actual puncturing number in result.

By using the above procedure for calculating the average puncturing distance q of the code symbol unit for each parity sequence, the absolute value of q always has a larger value than 2. Therefore, a uniformity of the puncturing pattern is maintained according to the preferred embodiments.

For example, assuming that the overall bit column to be rate-matched is constructed by 24 bits, namely, $N_C=24$, and $\Delta N$ is −12 by a generation of 50% puncturing for the overall bit column, 6 bits among the first parity sequence constructed by eight bits are punctured, namely the puncturing over 50% is generated. Equally, 6 bits are punctured even for the second parity sequence. In this case, in the parameter determination algorithm for calculating the inventive shifting parameter, it is calculated by the parameter $R=N-|\Delta N|=8-6=2$. Since "R=2" satisfies the condition of "$(R \neq 0)\&(2*R \leq N)$", the average puncturing distance q of the code symbol unit for the 1st parity sequence becomes "$\lceil 8/2 \rceil = 4$". In other words, in gaining the average puncturing distance, a bit number not punctured, as 2, is used instead of 6 as a bit number to be punctured. It can be noted that the shifting is performed on the basis of bits not having an occurrence of the puncturing in calculating the shifting values.

FIG. 14a shows the puncturing pattern on the virtual interleaver for the first parity sequence of the turbo code using the existing shifting parameter computing method. In FIG. 14a, assume that the overall bit column to be rate-matched is constructed by 24 bits, namely, $N_C=24$, and $\Delta N$ is −12 by a generation of 50% puncturing for this overall bit column. As shown in FIG. 14a, a position not having a generation of the puncturing occurs concentratedly on third and fourth rows and on seventh and eighth rows of the virtual interleaver.

FIG. 14b represents the puncturing pattern according to the preferred embodiments on the virtual interleaver for the 1st parity sequence, which is obtained by using the shifting parameter computing method modified for such a case. As shown in FIG. 14b, a position not having a generation of the puncturing becomes uniform as possible.

Finally, even though the puncturing over 50% occurs for the each parity sequence, according to preferred embodiments of the present invention, it can be noted that the absolute value of the average puncturing distance q based on the code symbol unit for each parity sequence always has a larger value than 2. If a quantity of the puncturing for each parity sequence becomes below 50%, the shifting value gained by the above-described method and the shifting value gotten by the existing method mutually coincide. The puncturing pattern on the virtual interleaver of each parity sequence can also gain that same uniform puncturing pattern.

A repetition procedure for the channel code of the uplink will now be described in another preferred embodiment according to the present invention. In the preferred embodiments of the rate matching procedures described above, K used in the parameter determination algorithm is determined as one out of values as 1, 2, 4 and 8. Also, q' is not an integer but a multiple of ⅛. The q is a medium parameter for getting the shifting parameter and indicates a mean repetition distance on the overall bit sequence.

In the preferred embodiments of the inventive repetition procedure, further, the shifting parameter per each column is determined by the parameter determination process, after that, a repetition procedure is preferably performed. Different from the puncturing procedure mentioned above, there is no need of performing the separate rate matching repetition to the branched-off coded bit stream. That is the rate matching repetition is performed over the coded bit stream that is not branched off.

The existing parameter determination algorithm is more based on the shifting parameter calculation provided for the sake of the puncturing procedure. Thus, if the existing parameter determination algorithm is applied to the repetition procedure as it is, various problems are caused. For example, a repetition rate considerable for each sequence inputted for a repetition procedure is currently more than 100%. Actually different from the puncturing procedure, there is no explicit upper limit to repetition ratio. When applying the current repetition procedure as it is, some problems occur when the repetition rate exceeds 50%. When the repetition rate is over 50%, in which a first problem is caused in case that the repetition rate exceeds 100%, and a second problem is caused when the repetition rate is near to 50% together with exceeding 50%.

First, a case where the repetition rate exceeds 100% for each inputted sequence is when the bit number repeated per each column, $\Delta N$, is larger than an input sequence size N. In this case, the q value is determined as '0', and therefore, the shifting parameter for the rest other columns excepting of a first column of the 1st interleaver is not allotted. That is, the shifting parameter computation per each column of the 1st interleaver is impossible.

Second, the existing parameter was decided by considering only a case that the repetition rate for the inputted sequences is under 0~50%, and a case of a repetition rate exceeding 50% was not considered.

Accordingly, a repetition pattern as shown in FIG. 15a can occur. FIG. 15a depicts the repetition pattern provided by using the basic parameter. If the parameter proper to the repetition rate of 51% is calculated by the parameter determination algorithm of computing the shifting parameter provided for the repetition procedure, the average repetition distance of the code symbol unit, q, has a smaller value than 2, as known in "$q=\lfloor N/|\Delta N|\rfloor=\lfloor 100/51\rfloor$". Finally, "q=1" is applied in the actual algorithm, thereby the shifting parameters for all columns of the 1st interleaver are calculated as 0.

In a case of N=11, $\Delta N$=6 and K=8, q becomes 1. Therefore, a finally computed shifting parameter becomes 0 and so the repetition pattern is represented as shown in FIG. 15a. That is, when it is the repetition rate over 50%, there occur cases that all bits are repeated on some rows and bits are never repeated on some rows, which destroys the uniformity requirements in the sequence before 1st interleaving.

In preferred embodiments according to the present invention for such cases, three methods for settling problems caused in the existed case that the repetition rate exceeds 50% will now be described.

A first method is the following shifting parameter computation procedure provided by considering when the repetition rate is near to 50% together with exceeding 50%. The shifting parameter to be applicable to each 1st interleaver memory column is preferably calculated for sequence inputted to the 1st interleaver, as follows.

```
" q = ⌊N/ΔN⌋
if(q<=2)
    for l=0 to K−1
        S[R[l mod K]]=(l mod 2)
else
if q is even
    then q' = q − GCD(q,K)/K
else
    q' = q
endif
for k=0 to K−1
    S[R[[k* q]mod K]]= ⌈k* q'⌉divK
end-for "
```

In such a case that the q value indicating the average repetition distance of the code symbol unit is computed as a value smaller than 2, the shifting parameter allotted per each column is determined as 0 and 1 alternately. In an example, when the input sequence size N is 11, and repeated bit numbers for the input sequence are determined as $\Delta N$=6 and K=8, the shifting parameter of 0 or 1 per each column is actually applied to the repetition algorithm. Finally, when the repetition rate is approximate to 50% together with exceeding 50%, positions of bits repeated as shown in FIG. 15b have a uniform repetition pattern on the rest rows excepting of a first row.

However, when the repetition rate is under 50%, the shifting parameter per each column of the virtual interleaver is calculated by "$S[R[\lceil k*q\rceil \bmod K]]=\lceil k*q'\rfloor divK$" similar to the existing method, and after that, the uplink repetition algorithm is performed by using the decided parameter value.

In a second method for a case that the repetition rate for the input sequence exceeds 100%, a shifting parameter computation procedure is provided by considering when the bit number $\Delta N$ repeated per each column is larger than the input sequence size N. The shifting parameter to be applied to each 1st interleaver memory column is calculated for sequence of the 1st interleaver, as follows. At this time, a parameter R is defined using the modulo operation, and R is used in computing a medium parameter q representing the average repetition distance overall the coded bit stream.

```
" R = |ΔN| mod N
    q = ⌊N/R⌋ ------- only if R ≠ 0
if q is even
    then q' = q − GCD(q,K)/K
else
        q' = q
endif
```

-continued

```
for k=0 to K−1
    S[R[⌈k* q⌉mod K]]= ⌈k* q'⌉divK
end-for"
```

When in the above the input sequence size N is 11 and a repeated bit number ΔN for the input sequence is 13, for example, R is calculated as 2 by "R=ΔN mod N". According to that, q is computed as 5 by "q=⌊N/R⌋", differently from the existed case that q is calculated as 0.

This value is applied to "S[R[⌈k*q⌉ mod K]]=⌈k*q'⌉ divK" to calculate the shifting parameter per each column of the 1st interleaver, and the uplink repetition algorithm is performed by using such decided parameter value. Finally, in case the repetition rate exceeds 100%, 100% repetition is executed for the inputted sequence. Then, a new q value for deciding the rest bit positions to be repeated is computed. According to that, positions of the rest repeated bits have a uniform repetition pattern by applying the shifting parameter value to the uplink repetition algorithm.

A third method is preferably provided by combining the above first and second methods. The third method combines the parameter determination procedures for a computation of two shifting parameters, which is applied to the cases that the repetition rate is near to 500% together with exceeding 50% and a bit number ΔN repeated per each column is larger than the input sequence size N.

The shifting parameter to be applied to each 1st interleaver memory column is calculated as follows for sequence inputted to the 1st interleaver. At this time, also, a parameter R is used in computing a medium parameter q representing the average repetition distance of the code symbol unit. In the following procedure, it can be applied even to a case of 'R=0'. Namely, a case that the repetition rate is 100% or 200%.

```
" R = ΔN mod N
  if(R=0) q=1;
  else q = ⌊N/ΔN⌋
endif
  if(q<=2)
    for l=0 to K−1
       S[R[l mod K]] = l mod 2
  else
    if q is even
      then q' = q − GCD(q,K)/K
    else
       q' = q
    endif
    for k=0 to K−1
       S[R[⌈k* q⌉mod K]]= ⌈k* q'⌉divK
    end-for"
```

The above algorithm is all applicable when the repetition rate is more than 100% available for the current input sequence. If the shifting parameter decided according to that is applied to the uplink repetition algorithm, the repetition pattern in which positions of repeated bits are completely uniform can be obtained.

As described above, the preferred embodiments according to present invention provide various advantages. First, a puncturing having a puncturing distance based on a uniform symbol unit for each parity sequence of RSC coders among puncturing conditions for a turbo code in an uplink can be obtained. Second, a uniform puncturing is embodied even in the uplink to remarkably increase an overall decoding performance, since the puncturing distance of the symbol unit can be designated, using the puncturing algorithm based on the existing bit unit as it is. Third, the uniform puncturing is satisfied regardless of a bit quantity to be punctured. Therefore, the same parameter can be applied thereto and used in the puncturing algorithm for a channel code of an uplink and a downlink.

In addition, when the puncturing for an overall input sequence turbo-coded in the uplink is more than 33.3%, the uniform puncturing condition is satisfied on each column and row of a virtual interleaving pattern. Thus, even in case that each puncturing rate is over 50% on 1st and 2nd parity sequences, the uniform puncturing condition is satisfied on each column and row of a virtual interleaving pattern.

Better pattern performance is obtained in case that the puncturing rate for the turbo-coded overall sequence is over 33.3%. Accordingly, its operation can be performed more smoothly for a limited upper range of the puncturing quantity not only in a normal mode but also in a compressed mode particularly.

According to the preferred embodiments, the shifting parameter per each column of a used interleaving pattern can be calculated even for any repetition rate. Especially, even in case that the repetition rate for the input sequence exceeds 100% and a bit number repeated per each column is larger than an input sequence size, each shifting parameter is again computed, for the rest other columns containing a first column of the interleaving pattern. Accordingly, a uniform repetition pattern can be gained by applying this shifting parameter to an uplink repetition algorithm. Further, in case the repetition rate for the input sequence is near to 50% together with exceeding 50%, the shifting parameter to be applied to the uplink repetition algorithm is computed by using a specifically added function(R). Thereby, a uniform repetition pattern can be obtained on remaining rows excepting of a first row according to a characteristic of the repetition algorithm.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A rate matching method for uplink of a mobile communication system, the method comprising:

interleaving turbo-coded bits which consist of a first sequence, a second sequence and a third sequence output from a turbo encoder at an interleaver;

determining a total number of bits to be punctured or repeated (ΔN) for the turbo-coded bits, a first number of bits to be punctured or repeated for the second sequence, a second number of bits to be punctured or repeated for the third sequence, and an average puncturing or repetition distance (q), wherein the first number and the second number are determined differently when (ΔN) is an odd number;

determining a first shifting parameter for the second sequence and a second shifting parameter for the third sequence, wherein the first and second shifting parameters are determined differently according to a value of (q); and performing a rate matching for each of the second sequence and the third sequence by using the determined first and second numbers and the determined the first and second shifting parameters.

2. The rate matching method according to claim 1, wherein the first number is determined as a largest integer number not greater than ($\Delta N/2$) and the second number is determined as a smallest integer number not less than ($\Delta N/2$).

3. The rate matching method according to claim 1, wherein (q) is determined differently for the second sequence and the third sequence when ($\Delta N$) is an odd number.

4. The rate matching method according to claim 1, wherein the first shifting parameter and the second shifting parameter are determined independently.

5. The rate matching method according to claim 1, wherein performing the rate matching comprises:
 performing the rate matching for the second sequence by using the determined first number and the determined first shifting parameter; and
 performing the rate matching for the third sequence by using the determined second number and the determined second shifting parameter.

6. The rate matching method according to claim 1, further comprising:
 determining an initial error offset value (eini) for use in performing the rate matching based on the determined first and second shifting parameters and a predetermined constant (a), wherein (eini) is determined differently for the second sequence and the third sequence based on the first and second shifting parameters.

7. The rate matching method according to claim 6, wherein (a) is predetermined differently for the second sequence and the third sequence.

8. The rate matching method according to claim 6, wherein (a) is predetermined as 2 for the second sequence and (a) is predetermined as 1 for the third sequence.

9. The rate matching method according to claim 1, wherein both the first and the second shifting parameters are determined differently according to whether (q) is greater than 2 and a modified average puncturing or repetition distance value (q') is used to determine the first and the second shifting parameters when (q) is an even number greater than 2.

10. The rate matching method according to claim 9, wherein (q') is calculated by subtracting a variable from (q), the variable determined based on a relation between (q) and a number of columns of interleaved turbo-coded bits (K).

11. The rate matching method according to claim 9, wherein (q') is defined as [(q)−gcd (q, K)/K], wherein (K) is a number of columns of interleaved turbo-coded bits and "gcd (q, K)" indicates a greatest common divisor of (q) and (K).

12. The rate matching method according to claim 1, wherein ($\Delta N$), the first number, the second number, (q), the first shifting parameter and the second shifting parameter are determined by a rate matching module and the rate matching is performed by the rate matching module.

13. The rate matching method according to claim 1, wherein the first sequence corresponds to a systematic sequence of the turbo-coded bits, the second sequence corresponds to a first parity sequence of the turbo-coded bits and the third sequence corresponds to a second parity sequence of the turbo-coded bits.

* * * * *